United States Patent
Rezzi et al.

(10) Patent No.: US 6,662,338 B1
(45) Date of Patent: Dec. 9, 2003

(54) PARITY-SENSITIVE VITERBI DETECTOR AND METHOD FOR RECOVERING INFORMATION FROM A READ SIGNAL

(75) Inventors: Francesco Rezzi, San Jose, CA (US); Marcus Marrow, Malahide (IE)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/409,923

(22) Filed: Sep. 30, 1999

(51) Int. Cl.$^7$ .................. H03M 13/03; H04L 23/02; G06F 1/12
(52) U.S. Cl. .................. 714/795; 714/796; 713/400; 375/262; 375/265; 375/341
(58) Field of Search ................. 714/795, 6, 7, 714/710, 800–805, 796; 375/341, 342, 265, 295, 340, 262; 713/400

(56) References Cited

U.S. PATENT DOCUMENTS

| | | | |
|---|---|---|---|
| 3,699,261 A | 10/1972 | Tomozawa | 370/509 |
| 4,142,174 A | 2/1979 | Chen et al. | 714/784 |
| 4,560,976 A | 12/1985 | Finn | 341/51 |
| 5,384,671 A | 1/1995 | Fisher | 360/51 |
| 5,430,744 A | 7/1995 | Fettweis et al. | 714/795 |
| 5,541,784 A | 7/1996 | Cribbs et al. | 360/75 |
| 5,614,901 A | 3/1997 | Haas | 341/68 |
| 5,729,396 A | 3/1998 | Dudley et al. | 360/51 |
| 5,751,744 A | 5/1998 | Babb | 714/800 |
| 5,774,078 A | 6/1998 | Tanaka et al. | 341/68 |
| 5,793,548 A | 8/1998 | Zook | 360/51 |
| 5,854,717 A | 12/1998 | Minuhin | 360/65 |
| 5,870,040 A | 2/1999 | Ando | 341/106 |
| 5,896,405 A | 4/1999 | Moon | 714/795 |
| 5,995,312 A | 11/1999 | Macleod | 360/66 |
| 6,041,421 A * | 3/2000 | Yamamoto | 714/7 |
| 6,072,410 A | 6/2000 | Kim | 341/81 |
| 6,078,468 A | 6/2000 | Fiske | 360/104 |
| 6,237,109 B1 * | 5/2001 | Achiva et al. | 714/6 |
| 6,239,935 B1 | 5/2001 | Shrinkle | 360/75 |
| 6,275,346 B1 | 8/2001 | Kim et al. | 360/31 |
| 6,356,401 B1 | 3/2002 | Bates et al. | 360/51 |
| 6,414,807 B2 | 7/2002 | Bates et al. | 360/51 |
| 6,492,918 B1 | 12/2002 | Rezzi et al. | 341/68 |

* cited by examiner

Primary Examiner—Emmanuel L. Moise
(74) Attorney, Agent, or Firm—Lisa K. Jorgenson; Bryan A. Santarelli

(57) ABSTRACT

A Viterbi detector receives a signal that represents a sequence of values. The detector recovers the sequence from the signal by identifying surviving paths of potential sequence values and periodically eliminating the identified surviving paths having a predetermined parity. By recognizing the parity of portions of a data sequence, such a Viterbi detector more accurately recovers data from a read signal having a reduced SNR and thus allows an increase in the storage density of a disk drive's storage disk. Specifically, the Viterbi detector recovers only sequence portions having a recognized parity such as even parity and disregards sequence portions having unrecognized parities. If one encodes these sequence portions such that the disk stores them having the recognized parity, then an erroneously read word is more likely to have an unrecognized parity than it is to have the recognized parity. Therefore, by disregarding words that have unrecognized parities, the: accuracy, of such a Viterbi detector is considerably greater than the accuracy of prior Viterbi detectors, which cannot distinguish sequence portions based on parity. This greater accuracy allows the Viterbi detector to more accurately recover data from a read signal having a relatively low SNR, and thus allows the Viterbi detector to more accurately recover data from a disk having a relatively high storage density.

40 Claims, 27 Drawing Sheets

| | Reg 0 | Reg 1 | Reg 2 | Reg 3 |
|---|---|---|---|---|
| $A_{k+3}$ | 0 | 1 | 0 | 1 |
| $A_{k+2}$ | 0 | 0 | 1 | 1 |
| $A_{k+1}$ | 0 | 0 | 1 | 1 |
| $A_k$ | 0 | 0 | 0 | 0 |
| $A_{k-1}$ | 0 | 0 | 0 | 0 |

Fig.10b

PARITY-SENSITIVE VITERBI DETECTOR AND METHOD FOR RECOVERING INFORMATION FROM A READ SIGNAL

CROSS-REFERENCE TO RELATED APPLICATIONS

This application is related to U.S. patent application Ser. No. 09/410,276, entitled CODE AND METHOD FOR ENCODING DATA, now U.S. Pat. No. 6,492,918, and U.S. patent application Ser. No. 09/410,274 entitled SYNC MARK DETECTOR, both of which are being filed concurrently with the present application, which are incorporated by reference.

TECHNICAL FIELD OF THE INVENTION

The invention is related generally to electronic circuits, and more particularly to a parity-sensitive Viterbi detector and technique for recovering information from a read signal. In one embodiment, the Viterbi detector is parity sensitive, and recovers only data sequences having the correct parity. Such parity checking allows the Viterbi detector to more accurately recover information from a read signal having a reduced signal-to-noise ratio (SNR). By allowing the read signal to have a reduced SNR, the Viterbi detector allows one to increase the area density (number of storage locations per square inch) of a storage disk.

BACKGROUND OF THE INVENTION

The storage capacity of a magnet disk is typically limited by the disk surface area and the minimum read-signal SNR specified for the data recovery circuit. Specifically, the diameter of the disk, and thus the disk surface area, are typically constrained to industry-standard sizes. Therefore, the option of increasing the surface area of the disk to increase the disk's storage capacity is usually unavailable to disk-drive manufacturers. Furthermore, the SNR of the read signal is a function of the data-storage density on the surface or surfaces of the disk; the higher the storage density, the lower the SNR of the read signal, and vice-versa. Typically, as the SNR of the read signal decreases, the number of read errors that the recovery circuit introduces into the recovered data increases. Unfortunately, an increase in the number of read errors may degrade the effective data-recovery speed of a disk drive to unacceptable levels.

FIG. 1 is a circuit block diagram of part of a conventional disk drive 10, which includes a magnetic storage disk 12 and a read channel 14 for reading data from the disk 12. The read channel 14 includes a read head 16 for sensing the data stored on the disk 12 and for generating a corresponding read signal. A read circuit 18 amplifies and samples the read signal and digitizes the samples, and a digital Viterbi detector 20 recovers the stored data from the digitized samples.

Typically, the greater the data-storage density of the disk 12, the greater the noise the read head 16 picks up while reading the stored data, and thus the lower the SNR of the read signal. The disk 12 typically has a number of concentric data tracks (not shown in FIG. 1) that each have a respective number of data-storage locations. The storage density of the disk 12 is a function of the distances between storage locations along the circumferences of the respective tracks and the distances between respective tracks. The smaller these distances, the higher the storage density, and thus the closer the surrounding storage locations to the read head 16 when it is reading the surrounded location. The closer the surrounding locations to the read head 16, the greater the magnitudes of the magnetic fields that these locations respectively generate at the head 16, and thus the greater the Inter Symbol Interference (ISI). The greater the ISI, the smaller the root-mean-square (rms) amplitude of the read signal. In addition, as the storage density increases, the media noise increases. Generally, the media noise results from the uncertainty in the shapes of the read pulses that constitute the read signal. This uncertainty is caused by unpredictable variations in the positions of the data storage locations from one data-write cycle to the next. Moreover, for a given disk spin rate, as the linear storage density along the tracks increases, the bandwidth of the read head 16 must also increase. This increase in bandwidth causes an increase in the white noise generated by the read head 16. The SNR of the read signal for a particular storage location is the ratio of the rms amplitude of the corresponding read pulse to the sum of the amplitudes of the corresponding media and white noise. Thus, the lower the rms amplitudes of the read pulses and the greater the amplitudes of the media and/or white noise, the lower the SNR of the read signal.

Unfortunately, the Viterbi detector 20 often requires the read signal from the head 16 to have a minimum SNR, and thus often limits the data-storage density of the disk 12. Typically, the accuracy of the detector 20 decreases as the SNR of the read signal decreases. As the accuracy of the detector 20 decreases, the number and severity of read errors, and thus the time needed to correct these errors, increases. Specifically, during operation of the read channel 14, if the error processing circuit (not shown) initially detects a read error, then it tries to correct the error using conventional error-correction techniques. If the processing circuit cannot correct the error using these techniques, then it instructs the read channel 14 to re-read the data from the disk 12. The time needed by the processing circuit for error detection and error correction and the time needed by the read channel 14 for data re-read increase as the number and severity of the read errors increase. As the error-processing and data re-read times increase, the effective data-read speed of the channel 14, and thus of the disk drive 10, decreases. Therefore, to maintain an acceptable effective data-read speed, the read channel 14 is rated for a minimum read-signal SNR. Unfortunately, if one decreases the SNR of the read signal below this minimum, then the accuracy of the read channel 14 degrades such that at best, the effective data-read speed of the disk drive 10 falls below its maximum rated speed, and at worst, the disk drive 10 cannot accurately read the stored data.

Overview of Conventional Viterbi Detectors, Read Channels, and Data Recovery Techniques To help the reader more easily understand the concepts discussed above and the concepts discussed below in the description of the invention, a basic overview of conventional read channels, digital Viterbi detectors, and data recovery techniques follows.

Referring again to FIG. 1, the digital Viterbi detector 20 "recovers" the data stored on the disk 12 from the digitalized samples of the read signal generated by the read circuit 18. Specifically, the read head 16 reads data from the disk 12 in a serial manner. That is, assuming the stored data is binary data, the read head 16 senses one or more bits at a time as the surface of the disk 12 spins it, and generates a series of sense voltages that respectively correspond to the sensed bits. This series of sense voltages composes the read signal, which consequently represents these sensed data bits in the order in which the head 16 sensed them. Unfortunately, because the disk 12 spins relatively fast with respect to the read head 16, the read signal is not a clean logic signal having two distinct levels that respectively represent logic 1 and logic 0. Instead, the read signal is laden with noise and inter-symbol interference (ISI), and thus more closely resembles a continuous analog signal than a digital signal. Using the sample clock, which is generated with circuitry that is omitted from FIG. 1, the read circuit 18 samples the read signal at points that correspond to the read head 16 being aligned with respective bit storage locations on the surface of the disk 12. The read circuit 18 digitizes these samples, and from these digitized samples, the Viterbi detector 20 ideally generates a sequence of bit values that is the same as the sequence of bit values stored on the disk 12 as described below.

FIG. 2 is a block diagram of the Viterbi detector 20 of FIG. 1. The detector 20 receives the digitized read-signal samples from the read circuit 18 (FIG. 1) on an input terminal 22. A data-sequence-recovery circuit 24 processes these samples to identify the bits represented by the read signal and then provides these identified bits to shift registers 26, which reproduce the stored data sequence from these bits. The detector 20 then provides this reproduced data sequence on an output terminal 28 as the recovered data sequence.

For example purposes, the operation of the Viterbi detector 20 is discussed in conjunction with a Decode data-recovery protocol, it being understood that the concepts discussed here generally apply to other Viterbi detectors and other data-recovery protocols.

Assuming a noiseless read signal and binary stored data, the read circuit 18, which in this example is designed to implement the Decode protocol, generates ideal digitized read-signal samples B having three possible relative values: −1, 0, and 1. These values represent respective voltage levels of the read signal, and are typically generated with a 6-bit analog-to-digital (A/D) converter. For example, according to one 6-bit convention, −1=111111, 0=000000, and 1=011111. The value of the ideal sample B at the current sample time k, i.e., $B_k$, is related to the bit values of the stored data sequence according to the following equation:

$$B_k = A_k - A_{k-1} \quad (1)$$

$A_k$ is the current bit of the stored data sequence, i.e., the bit that corresponds to the portion of the read signal sampled at the current sample time k. Likewise, $A_{k-1}$ is the immediately previous bit of the stored data sequence, i.e., the bit that corresponds to the portion of the read signal sampled at the immediately previous sample time k−1. Table I includes a sample portion of a sequence of bit values A and the corresponding sequence of ideal samples B for sample times k−k+6.

TABLE I

|   | k | k + 1 | k + 2 | k + 3 | k + 4 | k + 5 | k + 6 |
|---|---|-------|-------|-------|-------|-------|-------|
| A | 0 | 1     | 1     | 0     | 1     | 0     | 0     |
| B | 0 | 1     | 0     | −1    | 1     | −1    | 0     |

Referring to Table I, $B_{k+1} = A_{k+1} - A_k = 1$, $B_{k+2} = A_{k+2} - A_{k+1} = 0$, and so on. Therefore, by keeping track of the immediately previous bits A, one can easily calculate the value of current bit A from the values of the immediately previous bit A and the current sample B. For example, by rearranging equation (1), we get the following:

$$A_k = B_k + A_{k-1} \quad (2)$$

Equation (2) is useful because $B_k$ and $A_{k-1}$ are known and $A_k$ is not. That is, we can calculate the unknown value of bit $A_k$ from the values of the current sample $B_k$ and the previously calculated, and thus known, bit $A_{k-1}$. It is true that for the very first sample $B_k$ there is no previously calculated value for $A_{k-1}$. But the values of $A_k$ and $A_{k-1}$ can be determined from the first $B_k$ that equals 1 or −1, because for 1 and −1 there is only one respective solution to equation (1). Therefore, a data sequence can begin with a start value of 010101 . . . to provide accurate initial values for $B_k$, $A_k$, and $A_{k-1}$.

Unfortunately, the read signal is virtually never noiseless, and thus the read circuit 18 generates non-ideal, i.e., noisy, digitized samples Z, which differ from the ideal samples B by respective noise components. Table II includes an example sequence of noisy samples Z that respectively corresponds to the ideal samples B and the bits A of Table 1.

TABLE II

|   | k   | k + 1 | k + 2 | k + 3 | k + 4 | k + 5 | k + 6 |
|---|-----|-------|-------|-------|-------|-------|-------|
| A | 0   | 1     | 1     | 0     | 1     | 0     | 0     |
| B | 0   | 1     | 0     | −1    | 1     | −1    | 0     |
| Z | 0.1 | 0.8   | −0.2  | −1.1  | 1.2   | −0.9  | 0.1   |

For example, the difference between $Z_k$ and $B_k$ equals a noise component of 0.1, and so on.

According to one technique, a maximum-likelihood detector (not shown) recovers the bits A of the stored data sequence by determining and then using the sequence of ideal samples B that is "closest" to the sequence of noisy samples Z. The closest sequence of samples B is defined as being the shortest Euclidean distance λ from the sequence of samples Z. Thus, for each possible sequence of samples B, the detector 20 calculates the respective distance λ according to the following equation:

$$3) \quad \lambda = \sum_{y=k}^{y=k+n} (Z_y - B_y)^2$$

For example, for the B and Z sequences of Table II, one gets:

$$\lambda = (0.1-0)^2 + (0.8-1)^2 + (-0.2-0)^2 + (-1.1--1)^2 + (1.2-1)^2 + (-0.9--1)^2 + (0.1-0)^2 = 0.16 \quad 4)$$

Referring again to Tables I and 11, there are seven samples B in each possible sequence of B samples. Because the bits A each have two possible values (0 and 1) and because the sequence of B samples is constrained by equations (1) and (2), there are $2^7$ possible sequences of B samples (the sequence of B samples in Tables I and II is merely one of these possible sequences). Using equation (4), a maximum-likelihood detector should calculate $2^7$ λ values, one for each possible sequence of B samples. The sequence of B samples that generates the smallest λ value is the closest to the generated sequence of Z samples. Once the maximum-likelihood detector identifies the closest sequence of B samples, it uses these B samples in conjunction with equation (2) to recover the bits A of the stored data sequence.

Unfortunately, because most sequences of Z samples, and thus the corresponding sequences of B samples, include hundreds or thousands of samples, this maximum-likelihood technique is typically too computationally complex and time consuming to be implemented in a practical manner. For example, for a relatively short data sequence having one thousand data bits A, i=999 in equation (3) such that the Z sequence includes 1000 Z samples and there are $2^{1000}$ possible B sequences that each include 1000 B samples. Therefore, using equation (3), the maximum-likelihood detector would have to calculate $2^{1000}$ values for λ, each of these calculations involving 1000 Z samples and 1000 B samples! Consequently, the circuit complexity and time required to perform these calculations would likely make the circuitry for a maximum-likelihood detector too big, too expensive, or too slow for use in a conventional disk drive.

Therefore, referring to FIGS. 3–11, the Viterbi detector 20 (FIG. 2) implements a technique called dynamic programming to identify the sequence of ideal B samples that is closest to the sequence of actual Z samples. Dynamic programming is less computationally intensive than the above-described technique because it experiences only a linear increase in processing complexity and time as the length of the data stream grows. Conversely, the above-described technique experiences an exponential increase in processing complexity and time as the length of the data stream grows.

Referring to FIG. 3, dynamic programming is best explained using a trellis diagram 30, which represents a detection algorithm that the Viterbi detector 20 executes. The trellis 30 includes possible data-stream states S0–S3 at Z sample times k–k+n, and for example purposes is constructed for the Viterbi detector 20 operating according to A Decode data-recover protocol, it being understood that trellises for other data-recovery protocols have similar characteristics. Also, one should understand that the trellis 30 is not a physical circuit or device. It is merely a state diagram that illustrates the operation of the Viterbi detector 20 as it implements dynamic programming according to A Decode data-recovery protocol.

As illustrated by the trellis 30, at any particular Z sample time k–k+n, the two most recent bits A and $A_{-1}$ of the binary data sequence have one of four possible states S: S0=00, S1=01, S2=10, and S3=11. Therefore, the trellis 30 includes one column of state circles 32 for each respective sample time k–k+n. Within each circle 32, the right-most bit 34 represents a possible value for the most recent bit A of the data sequence at the respective sample time, and the left-most bit 36 represents a possible value for the second most recent bit A. For example, in the circle 32b, the bit 34b represents a possible value (logic 1) for the most recent bit A of the data sequence at sample time k, i.e., $A_k$, and the bit 34b represents a possible value (logic 0) for the second most recent bit $A_{k-1}$. Each circle 32 includes possible values for the most recent and second most recent bits A and $A_{-1}$, respectively, because according to equation (1), B depends on the values of the most recent bit A and the second most recent bit $A_{-1}$. Therefore, the Viterbi detector 20 can calculate the respective B sample for each circle 32 from the possible data values A and $A_{-1}$ within the circle.

Also as illustrated by the trellis 30, only a finite number of potential state transitions exist between the states S at one sample time k–k+n and the states S at the next respective sample time k+1–k+n+1. "Branches" 38 and 40 represent these possible state transitions. Specifically, each branch 38 points to a state having logic 0 as the value of the most recent data bit A, and each branch 40 points to a state having logic 1 as the value of the most recent data bit A. For example, if at sample time k the state is S0 (circle 32a) and the possible value of the next data bit $A_{k+1}$ is logic 0, then the only choice for the next state S at k+1 is S0 (circle 32e). Thus, the branch 38a represents this possible state transition. Likewise, if at sample time k the state is S0 (circle 32a) and possible value of the next data bit $A_{k+1}$ is logic 1, then the only choice for the next state S at k+1 is S1 (circle 32f). Thus, the branch 40a represents this possible state transition. Furthermore, the value 42 represents the value of the next data bit $A_1$ pointed to by the respective branch 38 or 40, and the value 44 represents the value of B that the next data bit $A_1$ and equation (1) give. For example, the value 42c (logic 0) represents that the branch 38b points to logic 0 as the possible value of the next data bit $A_{k+1}$, and the value 44c (−1) represents that for the branch 38b, equation (1) gives $B_{k+1} = 0(A_{k+1}) - 1(A_k) = -1$.

In addition, the trellis 30 illustrates that for the sequence of bits A, the state transitions "fully connect" the states S at each sampling time to the states S at each respective immediately following sample time. In terms of the trellis 30, fully connected means that at each sampling time k–k+n, each state S0–S3' has two respective branches 38 and 40 entering and two respective branches 38 and 40 leaving. Therefore, the trellis 30 is often called a fully connected trellis.

Furthermore, the trellis 30 illustrates that the pattern of state transitions between adjacent sample times is time invariant because it never changes. In terms of the trellis 30, time invariant means that the pattern of branches 38 and 40 between states at consecutive sample times is the same regardless of the sampling times. That is, the branch pattern is independent of the sampling time. Therefore, the trellis is often called a fully connected trellis.

Still referring to FIG. 3, in operation, the Viterbi detector 20 calculates the "lengths" of the "paths" through the trellis 30 and recovers the sequence of data bits A that corresponds to the "shortest" path. Each path is composed of respective serially connected branches 38 or 40, and the length λ of each path (often called the path metric λ) equals the sum of the lengths X of the branches (often called the branch metrics X) that compose the path. Each branch length X is represented by the following equation:

$$X_y = (Z_y - B_y)^2 \qquad 5)$$

And each path length λ is represented by the following equation:

$$6) \quad \lambda_S = \sum_{y=k}^{y=k+n} X_y$$

Thus, during each sampling period between the respective sample times k–k+n, the Viterbi detector 20 updates the respective length λ of each path by adding the respective branch length X thereto. The path lengths λ are actually the same values as given by equation (3) for the sequences of B samples represented by the paths through the trellis 30. But major differences between the closest-distance and dynamic-programming techniques are 1) dynamic programming updates each path length λ once during each sample period instead of waiting until after the read circuit 18 has generated all of the samples Z, and 2) dynamic programming calculates and updates the path lengths λ for only the surviving paths through the trellis 30 (one to each state S as discussed below), and thus calculates significantly fewer λ values than the closest-distance technique. These differences, which are explained in more detail below, significantly reduce the processing complexity and time for data recovery as compared with the maximum-likelihood technique.

To minimize the number of trellis paths and path lengths λ that it monitors, the Viterbi detector 20 monitors only the "surviving" paths through the trellis 30 and updates and saves only the path lengths $\lambda_s$ of these surviving paths. The surviving path to a possible state S at a particular sample time is the path having the shortest length $\lambda_s$. For example, each of the states S0–S3 of the trellis 30 typically has one respective surviving path at each sample time k–k+n. Therefore, the number of surviving paths, and thus the computational complexity per sample period, depends only on the number of possible states S and not on the length of the data sequence. Conversely, with the maximum-likelihood technique described above, the computational complexity per sample period depends heavily on the length of the data sequence. Thus, the computational complexity of the dynamic-programming technique increases linearly as the length of the data sequence increases, whereas the computational complexity of the closest-distance technique increases exponentially as the length of the data sequence increases. For example, referring to the 1000-bit data sequence discussed above in conjunction with FIG. 2, the Viterbi detector 20 updates only four path lengths $\lambda_{s0}$–$\lambda_{s3}$ (one for each state S0–S3) using dynamic programming as compared to $2^{1000}$ path lengths $\lambda$ using the maximum-likelihood technique! If one increases the length of the data sequence by just one bit, the detector 20 continues to update only four path lengths $\lambda_{s0}$–$\lambda_{s3}$ using dynamic programming whereas the detector 20 must calculate twice as many path lengths $\lambda$—$2^{1001}=2\times 2^{1000}$—using the maximum-likelihood technique!

Referring to FIGS. 4A–11, an example of the operation of the Viterbi detector 20 of FIG. 2 is discussed where the detector 20 uses dynamic programming to recover the data sequence A of Table II using the sequence of Z samples also of Table II. FIGS. 3A, 4A, . . . , and 11 show the trellis diagram 30 and the surviving paths at respective sample times k−1–k+6, and FIGS. 3B, 4B, . . . , and 10B show the contents of four (one for each state S0–S3) shift registers Reg0–Reg3—these registers compose the shift register 26 of the detector 20—at the respective sample times. As discussed below, the surviving paths eventually converge such that the contents of the registers 26 are the same by the time the detector 20 provides the recovered data sequence on its output terminal 28.

Referring to FIG. 4A and Table II, the trellis 30 begins at sample time k−1, which is a don't-care state because the data sequence A actually begins at sample time k. During the sampling period t, which is the period between the sampling times k−1 and k, the Viterbi detector 20 (FIG. 2) receives the sample $Z_k=0.1$ on the input terminal 22. Next, the recovery circuit 24 of the detector 20 calculates the branch lengths $X_k$ for each of the respective branches 38 and 40 in accordance with equation (5). To perform these calculations, the circuit 24 uses the B samples 44 that are associated with the branches 38 and 40 as shown in FIG. 3. Table III shows the components $Z_k$ and $B_k$ and the resulting branch lengths $X_k$ and path lengths $\lambda_k$ of this calculation.

TABLE III

|  | $Z_k$ | $B_k$ | $X_k$ | $\lambda_k$ |
| --- | --- | --- | --- | --- |
| Branch 38a | 0.1 | 0 | 0.01 | 0.01 |
| Branch 40a | 0.1 | 1 | 0.81 | 0.81 |
| Branch 38b | 0.1 | −1 | 1.21 | 1.21 |
| Branch 40b | 0.1 | 0 | 0.01 | 0.01 |
| Branch 38c | 0.1 | 0 | 0.01 | 0.01 |
| Branch 40c | 0.1 | 1 | 0.81 | 0.81 |

TABLE III-continued

|  | $Z_k$ | $B_k$ | $X_k$ | $\lambda_k$ |
| --- | --- | --- | --- | --- |
| Branch 38d | 0.1 | −1 | 1.21 | 1.21 |
| Branch 40d | 0.1 | 0 | 0.01 | 0.01 |

Because the branch lengths $X_k$ between the states at sample times k−1 and k are the first branch lengths calculated, $\lambda_k=X_k$ for all branches. The path lengths $\lambda_k$ from Table III label the respective branches in FIG. 4A for clarity.

Next, the recovery circuit 24 identifies the shortest path to each state at sample time k, i.e., the surviving paths. Referring to state S0 at sample time k, both incoming paths have lengths $\lambda_k=0.01$. Therefore, both paths technically survive. But for ease of calculation, the recovery circuit 24 arbitrarily eliminates the path originating from the highest state (S2 here) at time k−1, i.e., the path along branch 38c. Alternatively, the recovery circuit 24 could eliminate the path along branch 38a instead. But as discussed below, the detector 20 recovers the proper data sequence regardless of the path that the circuit 24 eliminates. Similarly, referring to states S1–S3 at time k, both of their respective incoming paths have equal lengths $\lambda_k$, and thus the circuit 24 arbitrarily eliminates the path originating from the respective highest state. For clarity, the surviving paths are shown in solid line, and the eliminated paths are shown in dashed line.

Referring to FIG. 4B, once the Viterbi detector 20 identifies the surviving paths, the recovery circuit 24 loads the data bits A that compose the surviving paths into the respective shift registers Reg0–Reg3 of the shift register block 26 (FIG. 2). Reg0–Reg3 respectively correspond to the surviving paths ending at the states S0–S3. For example, referring to FIG. 4A, the recovery circuit 24 loads $A_k=0$ and $A_{k-1}=0$ into Reg0 because the surviving path, here branch 38a, connects bit 34a, which is $A_{k-1}=0$, with bit 34e, which is $A_k=0$. These bits are shifted into the left side of Reg0 such that they occupy the register locations indicated by the "$A_k$" and "$A_{-1}$" legends above Reg0–Reg3. Thus, the most recent value, here $A_k$, always occupies the left most location of Reg0. Likewise, $A_k$ and $A_{k-1}$ for the other surviving paths, here branches 40a, 38b, and 40b, are respectively shifted into Reg1–Reg3.

Referring to FIG. 5A, during the sampling period t+1 between the sample times k and k+1, the Viterbi detector 20 receives the sample $Z_{k+1}=0.8$. Next, the recovery circuit 24 calculates the branch length $X_{k+1}$ for each of the respective branches 38 and 40 between k and k+1 in accordance with equation (5), and updates the previous surviving path lengths $\lambda_k$ to get the new path lengths $\lambda_{k-1}$ according to equation (6). To perform these calculations, the circuit 24 uses the B samples 44 that are associated with the branches 38 and 40 as shown in FIG. 3. Table IV shows the components $Z_{k+1}$ and $B_{k+1}$ and the resulting branch lengths $X_{k-1}$ and path lengths $\lambda_{k-1}$ of this calculation.

TABLE IV

|  | $Z_{k+1}$ | $B_{k+1}$ | $X_{k+1}$ | $\lambda_{k+1}$ |
| --- | --- | --- | --- | --- |
| Branch 38e | 0.8 | 0 | 0.64 | 0.65 |
| Branch 40e | 0.8 | 1 | 0.04 | 0.05 |
| Branch 38f | 0.8 | −1 | 3.24 | 4.05 |
| Branch 40f | 0.8 | 0 | 0.64 | 1.45 |
| Branch 38g | 0.8 | 0 | 0.64 | 1.85 |
| Branch 40g | 0.8 | 1 | 0.04 | 1.25 |

TABLE IV-continued

|  | $Z_{k+1}$ | $B_{k+1}$ | $X_{k+1}$ | $\lambda_{k+1}$ |
|---|---|---|---|---|
| Branch 38h | 0.8 | −1 | 3.24 | 3.25 |
| Branch 40h | 0.8 | 0 | 0.64 | 0.65 |

The path lengths $\lambda_{k+1}$ from Table IV label the respective branches in FIG. 5A for clarity.

Next, the recovery circuit 24 identifies the shortest path to each state at time k+1, i.e., the surviving paths, which are shown in solid line in FIG. 5A. Referring to the state S0 at time k+1, the path that includes the branch 38e ($\lambda_{k+1}$=0.65) is shorter than the path that includes the branch 30g ($\lambda_{k+1}$=1.85). Therefore, the recovery circuit 24 eliminates the latter path, which is shown in dashed line, and updates the surviving path length $\lambda_{S0}$ for state S0 to equal to 0.65. Similarly, referring to the states S1–S3 at time k+1, the recovery circuit 24 eliminates the paths that include branches 40g, 38f, and 40f, respectively, and updates the surviving path lengths as follows: $\lambda_{S1}$=0.05, $\lambda_{S2}$=3.25, and $\lambda_{S3}$=0.65.

Referring to FIG. 5B, once the recovery circuit 24 identifies the surviving paths, it loads the data bits A that compose the surviving paths into the respective shift registers Reg0–Reg3. For example, referring to FIG. 5A, the recovery circuit 24 right shifts $A_{k+1}$=0 into Reg0 because the surviving path for S0, here the path that includes branches 38a and 38e, passes through S0 at k and k−1 and thus includes bits 34a ($A_{k-1}$=0), 34e ($A_k$=0), and 34i ($A_{k+1}$=0). Conversely, because the surviving path for S1 now passes through S0 at time k, the circuit 24 right shifts $A_{k+1}$=1 into Reg1 and loads $A_k$=$A_{k-1}$=0 from Reg0 into Reg1. Thus, Reg1 now includes the bits A that compose the surviving path to S1 at time k+1. Likewise, because the surviving path for S2 now passes through S3 at time k, the circuit 24 right shifts $A_{k+1}$=0 into Reg2 and loads $A_k$=$A_{k-1}$=1 from Reg3 into Reg2. Thus, Reg2 now includes the bits A that compose the surviving path to S2 at time k+1. Furthermore, because the surviving path for S3 passes through S3 and k and S1 and k−1, the recovery circuit 24 merely right shifts $A_{k+1}$=1 into Reg3.

Referring to FIG. 6A, during the sampling period t+2 between sample times k+1 and k+2, the Viterbi detector 20 receives a sample $Z_{k+2}$=0.2. Next, the recovery circuit 24 calculates the branch lengths $X_{k+2}$ for the respective branches 38 and 40 in accordance with equation (5), and updates the surviving path lengths $\lambda_{k-1}$ to get the new path lengths $\lambda_{k+2}$ according to equation (6). The new path lengths $\lambda_{k+2}$ label the respective branches originating from the states S at time k+1 for clarity.

Next, the recovery circuit 24 identifies the surviving paths to each state S at time k+2 in a manner similar to that discussed above in conjunction with FIG. 5A. The surviving paths are in solid line, the eliminated branches between k+1 and k+2 are in dashed line, and the previously eliminated branches are omitted for clarity. One can see that at time k, the surviving paths converge at S0. That is, all of the surviving paths to the states S at time k+2 pass through S0 at time k. Thus, the recovery circuit 24 has recovered $A_k$=0, which, referring to Table II, is the correct value for $A_k$ in the data sequence A.

Referring to FIG. 6B, once the recovery circuit 24 identifies the surviving paths, it shifts or loads the data bits A that compose the surviving paths into the respective shift registers Reg0–Reg3 as discussed above in conjunction with FIG. 5B. For example, referring to FIG. 6A, the recovery circuit 24 merely right shifts $A_{k+2}$=0 into Reg0 because the surviving path to S0, here the path that includes branches 38a, 38e, and 38i, passes through S0 at times k−1, k, and k+1 and thus includes bits 34a ($A_{k-1}$=0), 34e ($A_k$=0), 34i ($A_{k+1}$=0), and 34m ($A_{k+2}$=0). Likewise, the recovery circuit 24 shifts or loads the bits $A_{k+2}$, $A_{k-1}$, $A_k$, and $A_{k-1}$ that compose the other surviving paths into Reg1–Reg3. One can see that each of the locations $A_k$ in Reg0–Reg3 stores the same value, here logic 0. This confirms the convergence of the surviving paths to S0 at time k as discussed above in conjunction with FIG. 6A. Therefore, it follows that when the $A_k$ bits are shifted out of Reg0–Reg3, respectively, each bit $A_k$ will equal logic 0, which is the recovered value of the bit $A_k$. Thus, the output terminal 28 (FIG. 2) of the Viterbi detector 20 can be connected to the right-shift output of any one of the registers Reg0–Reg3.

Referring to FIG. 7A, during the sampling period t+3 between the sample times k+2 and k+3, the Viterbi detector 20 receives the sample $Z_{k+3}$=−1.1. Next, the recovery circuit 24 calculates the branch lengths $X_{k+3}$ for the respective branches 38 and 40 in accordance with equation (5), and updates the path lengths $\lambda_{k+2}$ to get the new path lengths $\lambda_{k+3}$ according to equation (6). The new path lengths $\lambda_{k+3}$ label the respective branches originating from the states S at time k+2 for clarity.

Next, the recovery circuit 24 identifies the surviving paths (solid lines) to each state S at time k+3. One can see that each of the states S0 and S1 technically have two surviving paths because the path lengths $\lambda_{k+3}$ for these respective pairs of paths are equal (both $\lambda_{k+3}$=1.9 for S0 and both $\lambda_{k+3}$=5.1 for S1). Therefore, as discussed above in conjunction with FIGS. 4A and 4B, the recovery circuit 24 arbitrarily selects the respective paths that pass through the lowest state S at k+2 as the surviving paths for S0 and S1.

Referring to FIG. 7B, once the recovery circuit 24 identifies the surviving paths, it left shifts or loads the data bits A that compose the surviving paths into the respective shift registers Reg0–Reg3. For example, referring to FIG. 7A, the recovery circuit 24 right shifts $A_{k+3}$=0 into Reg0 because the surviving path to S0—here the arbitrarily selected path that includes branches 38a, 38e, 38l, and 38m—passes through S0 at times k−1–k+2 and thus includes bits 34a ($A_{k-1}$=0), 34e ($A_k$=0), 34i ($A_{k+1}$=0), 34m ($A_{k+2}$=0), and 34q ($A_{k+3}$=0). Likewise, the recovery cir shifts or loads as appropriate the bits $A_{k+3}$, $A_{k+2}$, $A_{k-1}$, $A_k$, and $A_{k-1}$ of the other surviving paths into Reg1–Reg3.

Referring to FIG. 8A, during the sampling period t+4 between the sampling times k+3 and k+4, the Viterbi detector 20 receives a sample $Z_{k+4}$=1.2. Next, the recovery circuit 24 calculates the branch length $X_{k+4}$ for each of the respective branches 38 and 40 in accordance with equation (5), and updates the path lengths $\lambda_{k+3}$ to generate the new path lengths $\lambda_{k+4}$ according to equation (6). The path lengths $\lambda_{k+4}$ label the respective branches originating from the states S at time k+3 for clarity.

Next, the recovery circuit 24 identifies the surviving paths to each state S at time k+4. One can see that at time k+1 the surviving paths converge at S1, and that at time k+2 the surviving paths converge at S3. Thus, in addition to bit $A_k$, the recovery circuit 24 has recovered $A_{k+1}$=1 and $A_{k+2}$=1, which, referring to Table II, are the correct values for the $A_{k+1}$ and $A_{k+2}$ bits of the data sequence A.

Referring to FIG. 8B, once the recovery circuit 24 identifies the surviving paths, it right shifts or loads the data bits A that compose the surviving paths into the respective shift registers Reg0–Reg3. For example, the recovery circuit 24 right shifts $A_{k+4}$=0 and loads $A_{k+2}$=$A_{k-1}$=1 from Reg3 into the respective locations of Reg0. Referring to FIG. 8A, the circuit 24 does this because the surviving path to S0 at k+4—here the path that includes the branches 38a, 40e, 40j, 38p, and 38s—passes through S2 at k+3, S3 at k+2, S1 at k−1, and S0 at k and k−1, and thus includes bits 34a ($A_{k-1}$=0), 34e ($A_k$=0), 34j ($A_{k+1}$=1), 34p ($A_{k+2}$=1), 34s ($A_{k+3}$=0), and 34u ($A_{k+4}$=0). Likewise, the recovery circuit 24 shifts or loads as appropriate the bits $A_{k+4}$, $A_{k+3}$, $A_{k+2}$, $A_{k+1}$, $A_k$, and $A_{k-1}$ of the other surviving paths into Reg1–Reg3, respectively. One can see that each of the bits $A_{k-1}$–$A_{k+2}$ in Reg0–Reg3 has the same respective value, here $A_{k-1}$=0, $A_k$=0, $A_{k+1}$=1, $A_{k+2}$=1. This confirms convergence of the surviving paths to S1 at time k+1 and to S3 at time k+2 as discussed above in conjunction with FIG. 8A.

Referring to FIG. 9A, during the sampling period t+5 between sample times k+4 and k+5, the Viterbi detector 20 receives a sample $Z_{k+5}$=−0.9. Next, the recovery circuit 24 calculates the branch length $X_{k+5}$ for each of the respective branches 38 and 40 in accordance with equation (5), and updates the path lengths $\lambda_{k+4}$ to generate the new path lengths $\lambda_{k+5}$ according to equation (6). The updated path lengths $\lambda_{k+5}$ label the respective branches originating from the states S at time k+4 for clarity.

Next, the recovery circuit 24 identifies the surviving paths to each state S at time k+5. One can see that at time k+3, the surviving paths converge at S2. Thus, in addition to bits $A_k$, $A_{k-1}$, and $A_{k+2}$, the recovery circuit 24 has recovered $A_{k+3}$=0, which, referring to Table II, is the correct value for the bit $A_{k+3}$ of the data sequence A.

Referring to FIG. 9B, once the recovery circuit 24 identifies the surviving paths, it right shifts or loads the data bits A that compose the surviving paths into the respective shift registers Reg0–Reg3. For example, the recovery circuit 24 right shifts $A_{k+5}$=0 into Reg0. The circuit 24 does this because referring to FIG. 9A, the surviving path to S0 at k+5—here the path that includes branches 38a, 40e, 40j, 38p, 38s, and 38u—passes through S0 at k+4, S2 at k+3, S3 at k+2, S1 at k+1, and S0 at k and k−1 and thus includes bits 34a ($A_{k-1}$=0), 34e ($A_k$=0), 34j ($A_{k+1}$=1), 34p ($A_{k+2}$=1), 34s ($A_{k+3}$=0), 34u ($A_{k+4}$=0), and 34y ($A_{k+5}$=0). Likewise, the recovery circuit 24 shifts or loads as appropriate the bits $A_{k+5}$, $A_{k+4}$, $A_{k+3}$, $A_{k+2}$, $A_{k-1}$, $A_k$, and $A_{k-1}$ of the other surviving paths into Reg1–Reg3. One can see that the bits $A_{k-1}$–$A_{k+3}$ in Reg0–Reg3 are respectively the same, here $A_{k-1}$=0, $A_k$=0, $A_{k-1}$=1, $A_{k+2}$=1, and $A_{k+3}$=0. This confirms the convergence of the surviving paths to S2 at time k+3 as discussed above in conjunction with FIG. 9A.

Referring to FIG. 10A, during the sampling period t+6 between sample times k+5 and k+6, the Viterbi detector 20 receives a sample $Z_{k+6}$=0.1. The recovery circuit 24 calculates the branch length $X_{k+6}$ for each of the respective branches 38 and 40 in accordance with equation (5), and updates the path lengths $\lambda_{k+5}$ to generate the new path lengths $\lambda_{k+6}$ according to equation (6). The updated path lengths $\lambda_{k+6}$ label the respective branches originating from the states S at time k+5 for clarity.

Next, the recovery circuit 24 identifies the surviving paths to each state S at time k+6. One can see that at time k+4, the surviving paths converge at S1. Thus, in addition to bits $A_k$–$A_{k+3}$, the recovery circuit 24 has recovered $A_{k+4}$=1, which referring to Table II, is the correct value for the bit $A_{k+4}$ of the data sequence A.

Referring to FIG. 10B, once the recovery circuit 24 identifies the surviving paths, it right shifts or loads the data bits A that compose the surviving paths into the respective shift registers Reg0–Reg3. For example, the recovery circuit 24 right shifts $A_{k+6}$=0 and loads $A_{k+4}$=1 from Reg2 into Reg0. The circuit 24 does this because referring to FIG. 10A, the surviving path to S0 at k+6—here the path that includes branches 38a, 40e, 40j, 38p, 40s, 38v, and 38aa—passes through S2 at k+5, S0 at k+4, S2 at k+3, S3 at k+2, S1 at k+1, and S0 at k and k−1 and thus includes bits 34a ($A_{k-1}$=0), 34e ($A_k$32 0), 34j ($A_{k-1}$=1), 34p ($A_{k+2}$=1), 34s ($A_{k+3}$=0), 34v ($A_{k+4}$=1), 34aa ($A_{k+5}$=0), and 34cc ($A_{k+6}$=0). Likewise, the recovery circuit 24 shifts or loads as appropriate the bits $A_{k+6}$, $A_{k+5}$, $A_{k+4}$, $A_{k+3}$, $A_{k+2}$, $A_{k-1}$, $A_k$, and $A_{k-1}$ of the other surviving paths into Reg1–Reg3, respectively. One can see that the bits $A_{k-1}$–$A_{k+}$4 in Reg0–Reg3 are respectively the same, here $A_{k-1}$=0, $A_{k-1}$=0, $A_k$+0, $A_{k+1}$=1, $A_{k+2}$=1, $A_{k+3}$=0, and $A_{k+4}$=1. This confirms the convergence of the surviving paths to S1 at time k+4 as discussed above in conjunction with FIG. 10A.

FIG. 11 is the trellis diagram 30 of FIG. 10A showing only the surviving paths for clarity.

Referring again to FIGS. 4A–11, the latency of the Viterbi detector 20 of FIG. 2 is 4. Referring to FIGS. 7A–8B, the most samples Z that the detector 20 must process before times one must wait the surviving paths converge is 4. For example, the surviving paths do not converge at k+1, and thus the bit $A_{k+1}$ is not the same in all the registers Reg0–Reg3, until the sample time k+4. Therefore, the Viterbi detector 20 must process four samples $Z_{k+1}$–$Z_{k+4}$ before the bit $A_{k+1}$ is valid, i.e., before the value of the bit $A_{k+1}$ is the same in all of the registers Reg0–Reg3.

The Viterbi detector 20 continues to recover the remaining bits of the data sequence A in the same manner as described above in conjunction with FIGS. 4A–11. Because the detector 20 updates only 8 path lengths λk+6 and chooses only 4 surviving paths per sample period T regardless of the length of the data sequence A, the processing complexity and time increase linearly, not exponentially, with the length of the data sequence.

Although the trellis 30 is shown having four states S0–S3 to clearly illustrate the dynamic-programming technique, the Decode Viterbi detector 20 typically implements a trellis having two states, S0=0 and S1=1, to minimize the complexity of its circuitry.

SUMMARY OF THE INVENTION

In summary, the Viterbi detector 20 stores (in Reg0–Reg3) a respective history of each surviving path to a respective state (S) in a trellis diagram at least until all of the surviving paths converge into a single path that represents the recovered data sequence. More detailed information regarding the Viterbi detector 20 and other types of Viterbi detectors can be found in many references including "Digital Baseband Transmission and Recording," by Jan W. M. Bergmans, Kluwer Academic Publishers 1996, which is incorporated by reference.

In one aspect of the invention, a Viterbi detector receives a signal that represents a sequence of values. The detector recovers the sequence from the signal by identifying surviving paths of potential sequence values and periodically eliminating the identified surviving paths having a predetermined parity.

By recognizing the parity of portions of a data sequence, such a Viterbi detector more accurately recovers data from a read signal having a reduced SNR and thus allows an increase in the storage density of a disk drive's storage disk. Specifically, the Viterbi detector recovers only sequence portions having a recognized parity such as even parity and disregards sequence portions having unrecognized parities. If one encodes these sequence portions such that the disk stores them having the recognized parity, then an erroneously read word is more likely to have an unrecognized parity than it is to have the recognized parity. Therefore, by disregarding words that have unrecognized parities, the accuracy of such a Viterbi detector is considerably greater than the accuracy of prior Viterbi detectors, which cannot distinguish sequence portions based on parity. This greater accuracy allows the Viterbi detector to more accurately recover data from a read signal having a relatively low SNR, and thus allows the Viterbi detector to more accurately recover data from a disk having a relatively high storage density.

BRIEF DESCRIPTION OF THE DRAWINGS

FIG. 7B shows the corresponding contents of the Viterbi-detector shift registers of FIG. 2 for the trellis diagram of FIG. 7A.

Figure 8B:
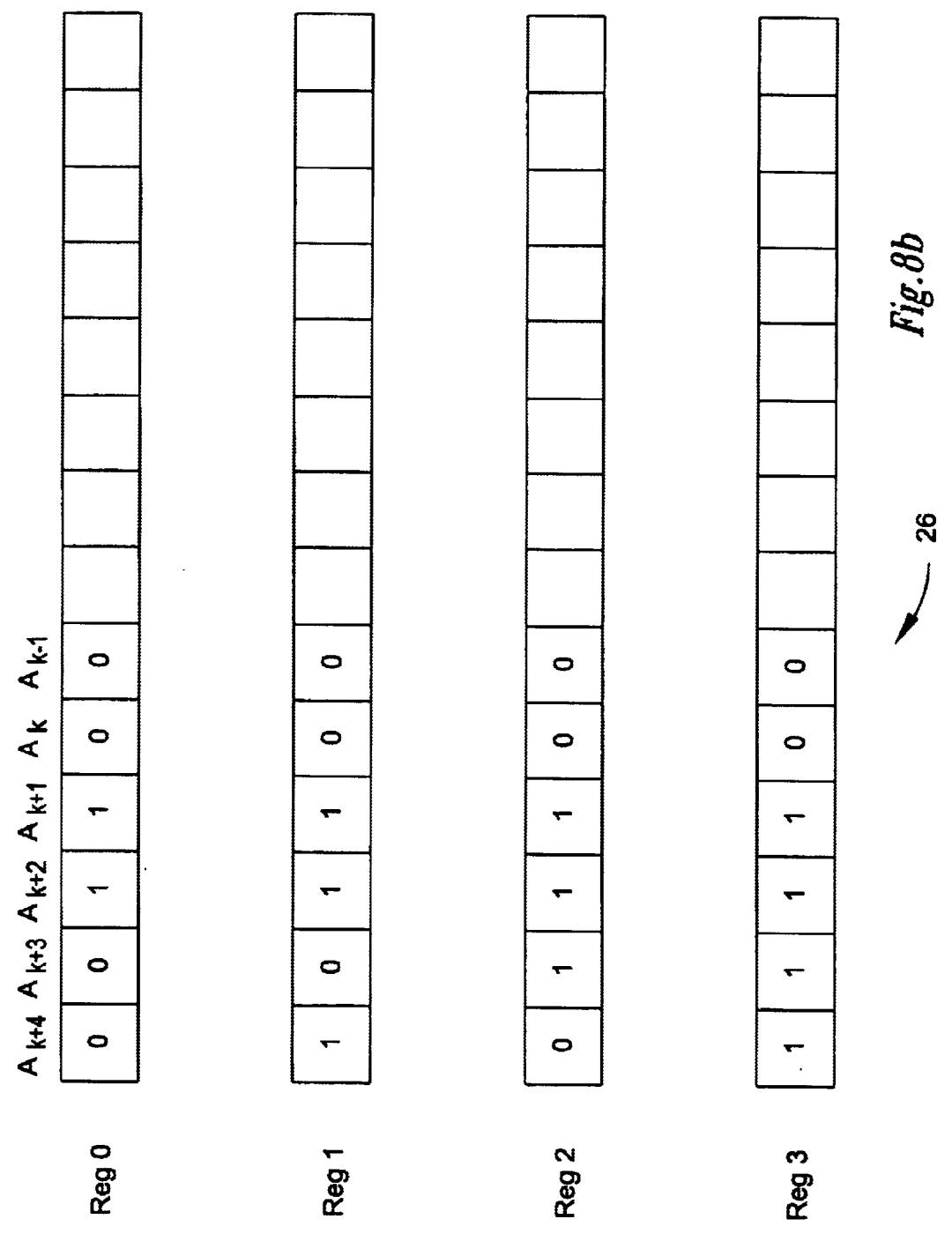

FIG. 8B shows the corresponding contents of the Viterbi-detector shift registers of FIG. 2 for the trellis diagram of FIG. 8A.

FIG. 9B shows the corresponding contents of the Viterbi-detector shift registers of FIG. 2 for the trellis diagram of FIG. 9A.

Figure 10B:
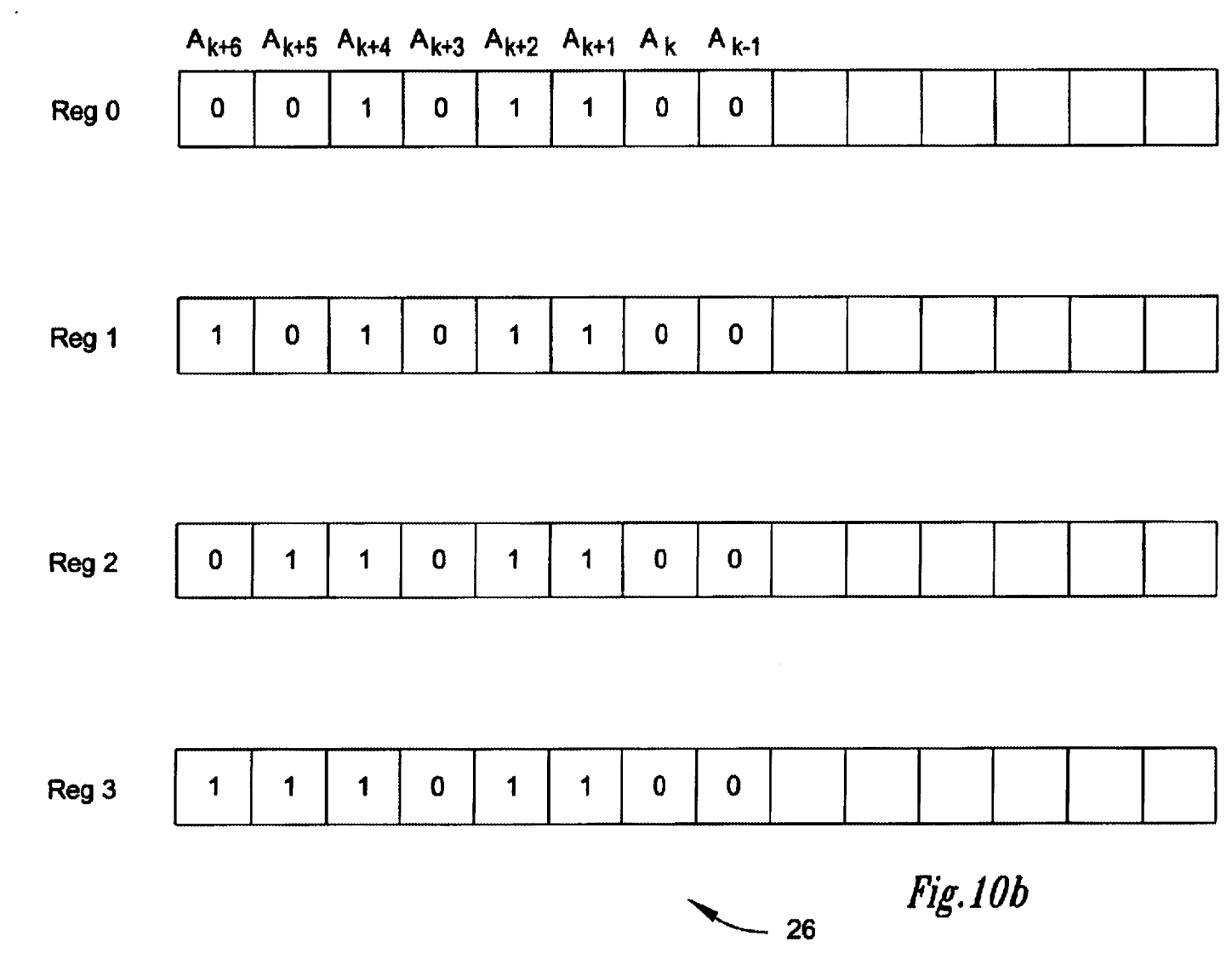

FIG. 10B shows the corresponding contents of the Viterbi-detector shift registers of FIG. 2 for the trellis diagram of FIG. 10A.

DESCRIPTION OF THE INVENTION

Figure 2:
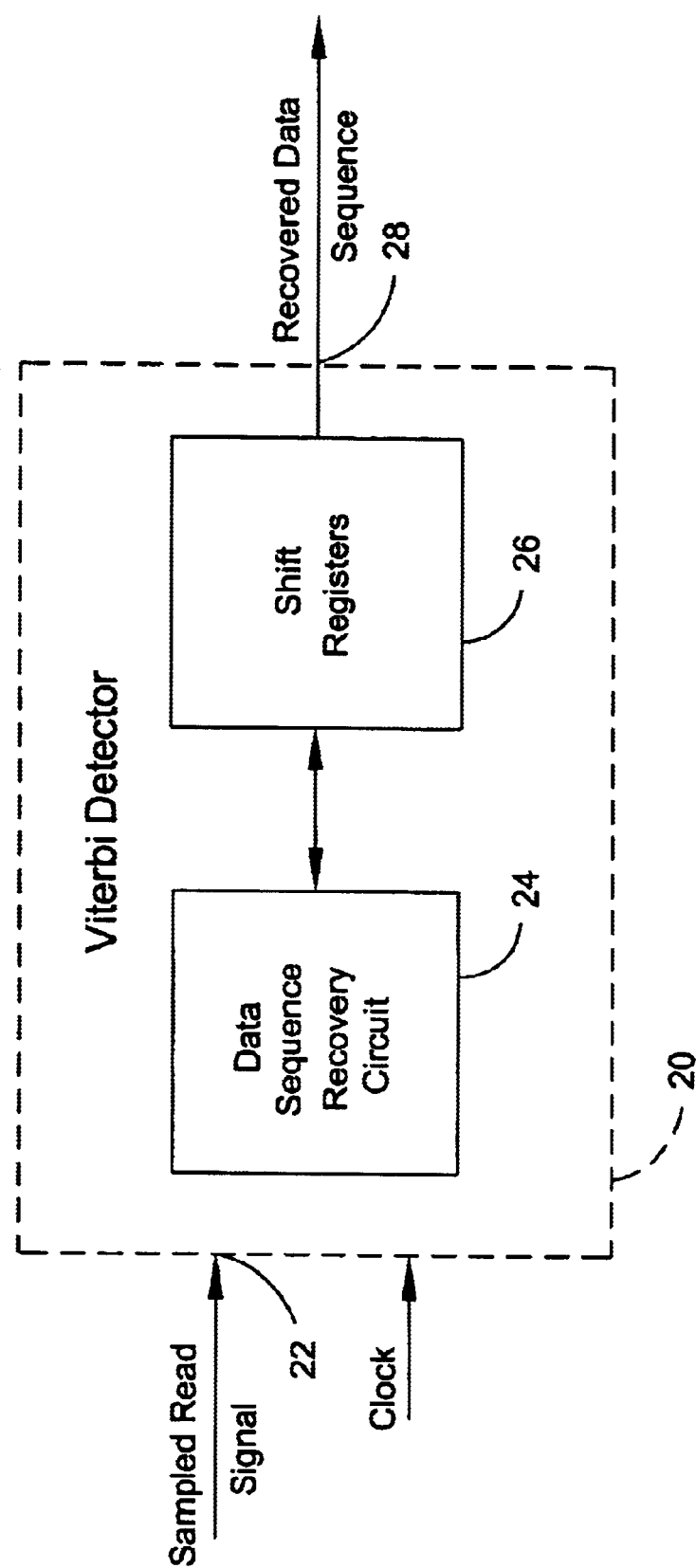
FIG. 2 is a block diagram of the conventional Viterbi detector of FIG. 1.
Figure 12:
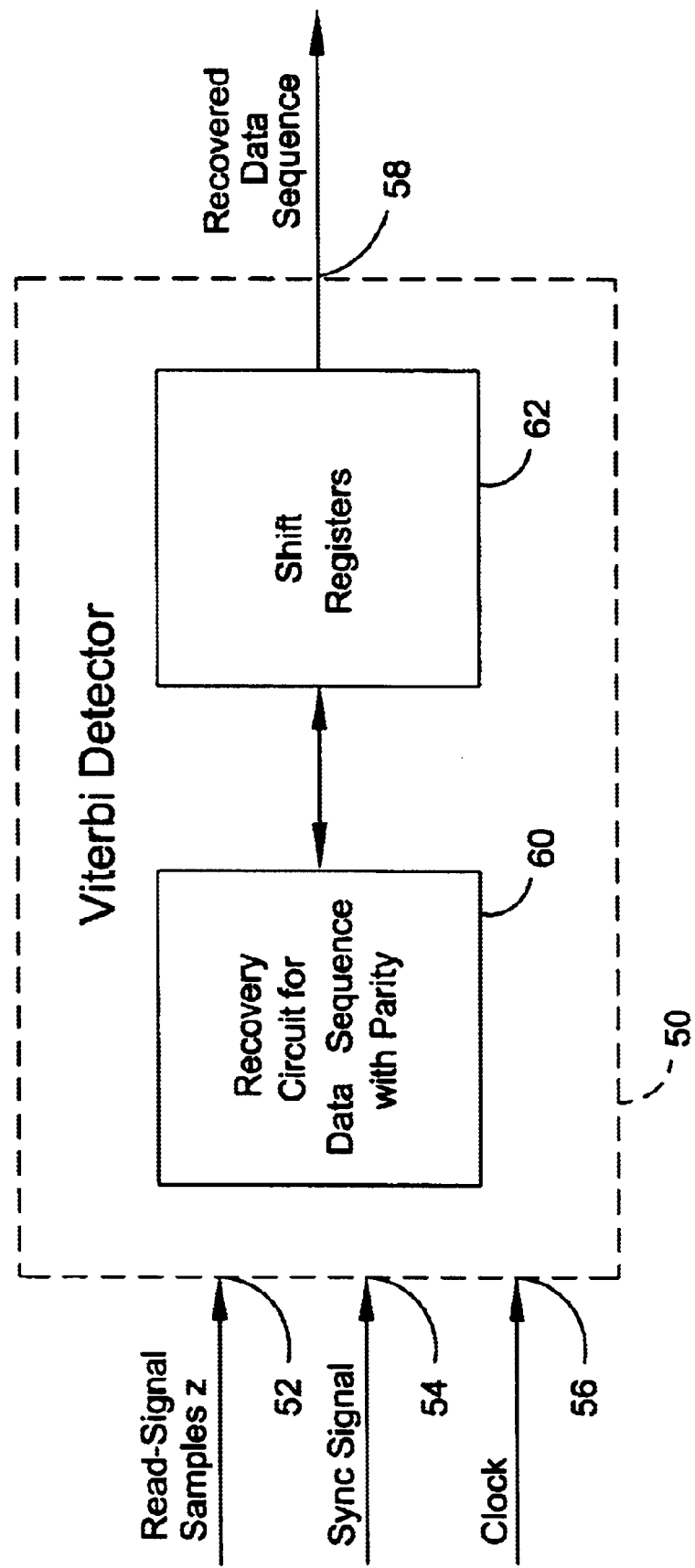
FIG. 12 is a block diagram of a parity-sensitive Viterbi detector according to an embodiment of the invention.

FIG. 12 is a block diagram of a Viterbi detector 50 according to an embodiment of the invention. The detector 50 is more accurate than prior Viterbi detectors such as the Viterbi detector 20 of FIG. 2, and thus can recover data values from a read signal having a relatively low SNR more accurately than prior Viterbi detectors can. This increased accuracy allows one to increase the storage density of a disk drive's storage disk. Specifically, the detector 50 recovers only sequence portions, i.e., words of data values within a data sequence, having a recognized parity. As long as the words are constructed to have the recognized parity, the inventors have discovered that an erroneously read word is more likely to have an unrecognized parity than it is to have the recognized parity. Therefore, by recovering only words that have the recognized parity, the detector 50 eliminates the majority of read errors and is thus more accurate than prior detectors. This increased accuracy allows the detector 50 to handle a read signal having a lower SNR than the read signals handled by prior detectors. Consequently, this ability to more accurately recover data from a read signal having a low SNR allows one to increase the storage density of the storage disk. Therefore, for a given disk area, this increase in storage density increases the data-storage capacity of the disk. In addition, if one increases the storage density by including more storage locations per track, then, for a given disk speed, one increases the effective data-read speed of the disk drive as well.

The Viterbi detector 50 includes a terminal 52 for receiving the samples Z of the read signal, a terminal 54 for receiving a synchronization signal, a terminal 56 for receiving a clock signal, and a terminal 58 for providing the recovered data sequence. In one embodiment, the sync and clock signals are binary logic signals, and the data sequence is binary. As discussed below, the sync signal identifies the beginning of the data sequence, and the detector 50 uses the clock signal—which in one embodiment is the same as or is derived from the read-signal sample clock—provides timing to the detector 50. The detector 50 also includes a recovery circuit 60 for extracting data-sequence words having a recognized parity from the read-signal samples Z. In addition, the detector 50 includes shift registers 62 for storing the surviving paths at least until they converge to the recovered data sequence and for providing the recovered data sequence to the terminal 58. In one embodiment, the shift registers 62 are similar to the shift registers 26 of FIG. 2.

In operation, the synchronization signal transitions from one logic state to the other to indicate that the next read sample Z represents the first bit of the data sequence. A circuit for generating the sync signal is disclosed in co-pending U.S. patent application Ser. No. 09/410,274 entitled SYNC MARK DETECTOR, which is heretofore incorporated by reference. In response to this transition of the sync signal, the circuit 60 process the next and subsequent read samples Z according to a trellis diagram that accounts for the parity of the data sequence. Such trellis diagrams are discussed below in conjunction with FIGS. 13–18. The circuit 60 uses these samples Z to calculate and update the surviving-path lengths λ, and stores the surviving paths in the shift registers 62 in a manner similar to that discussed above in conjunction with FIGS. 4B, 5B, 6B, 7B, 8B, 9B and 10B. One of the shift registers 62 shifts out the recovered data sequence onto the terminal 58 in a manner similar to that discussed above.

Figure 13:
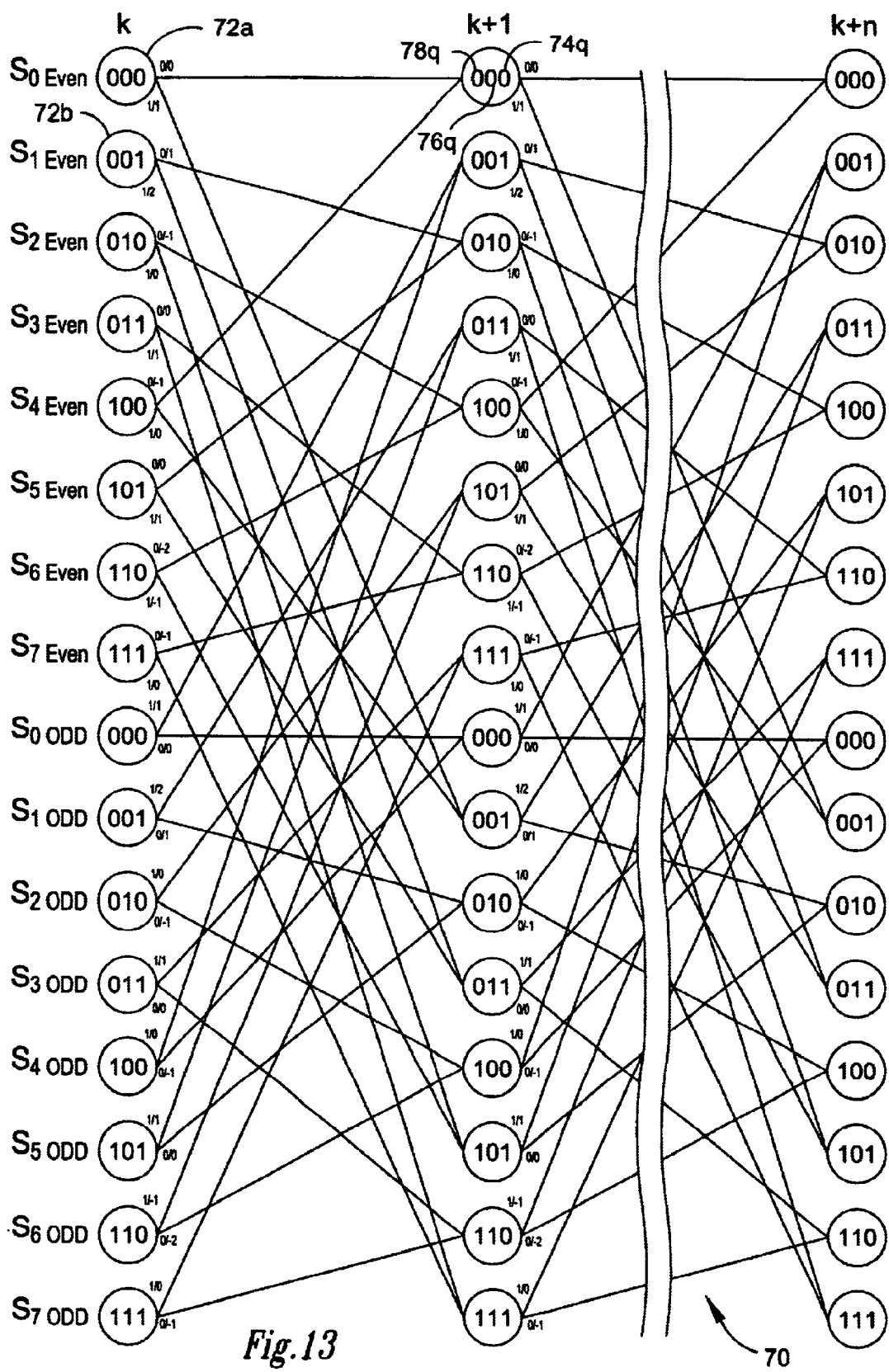
FIG. 13 is a trellis diagram for the Viterbi detector of FIG. 12 according to an embodiment of the invention.

FIG. 13 is a trellis diagram 70, which represents a detection algorithm that is designed for an EPR4 protocol and that causes the Viterbi detector 50 to recognize the parity of a data sequence according to an embodiment of the invention. According to the EPR4 protocol, $B_k$ is given by the following equation:

$$B_k = A_k + A_{k-1} - A_{k-2} - A_{k-3} \qquad (7)$$

Figure 3:
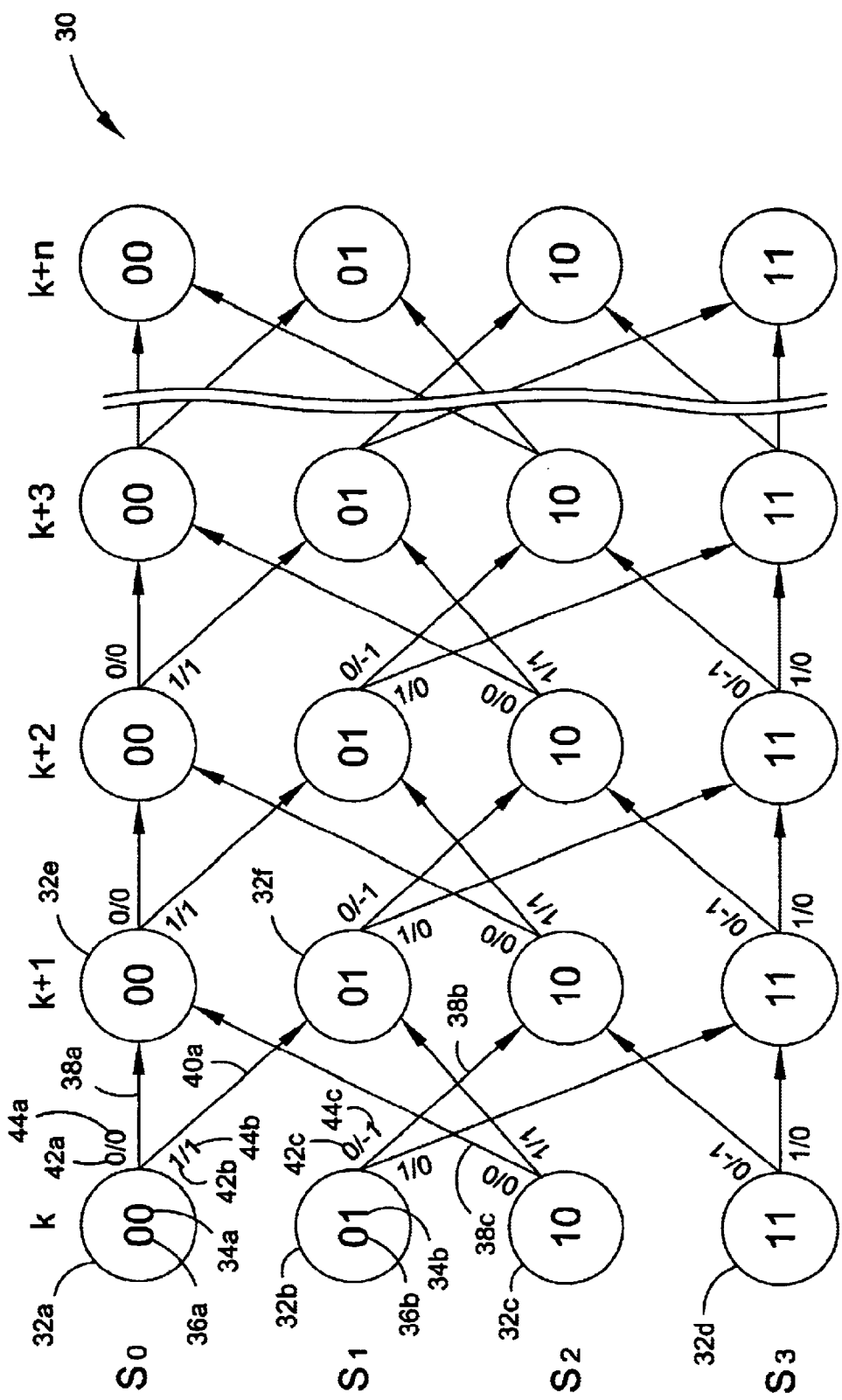
FIG. 3 is a conventional trellis diagram for the Viterbi detector of FIG. 2.
Figure 4A:
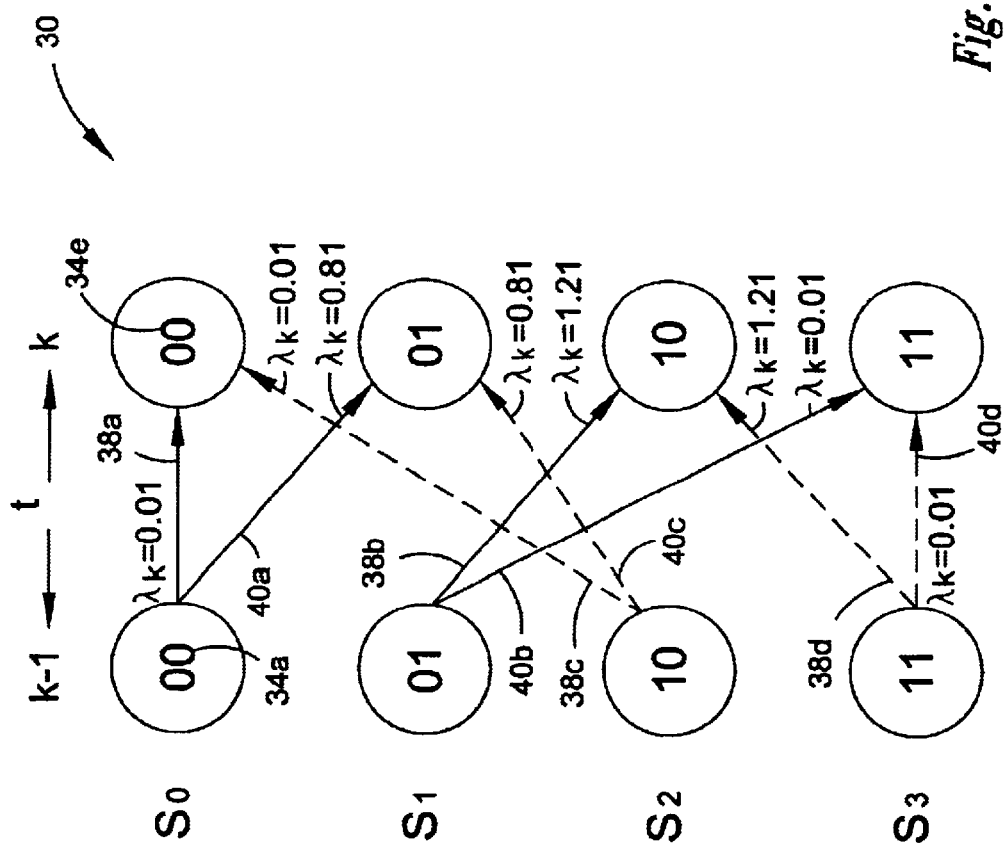
FIG. 4A is a trellis diagram at a sample time during the recovery of a data sequence by the Viterbi detector of FIG. 2.
Figure 4B:
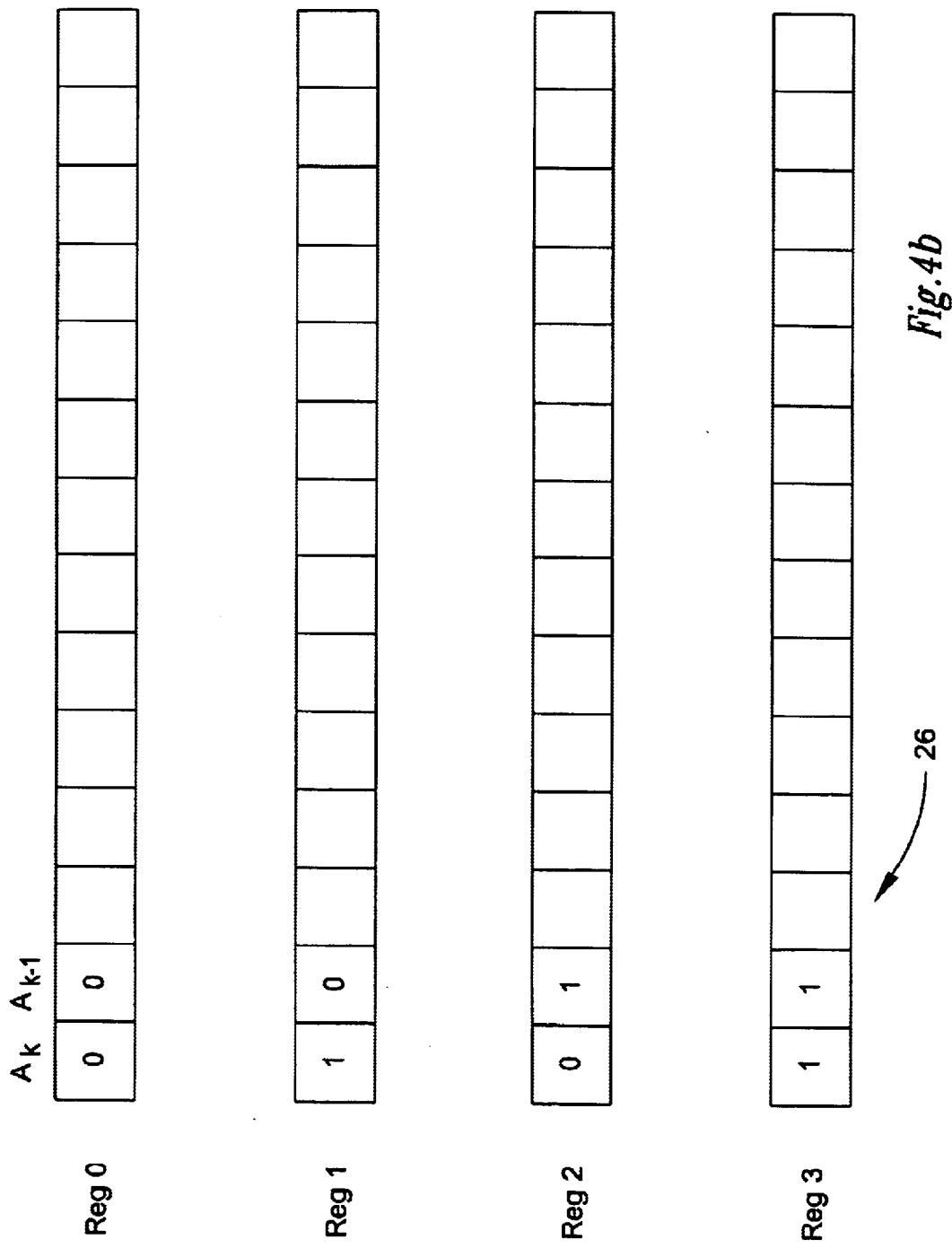
FIG. 4B shows the corresponding contents of the Viterbi-detector shift registers of FIG. 2 for the trellis diagram of FIG. 4A.
Figure 5A:
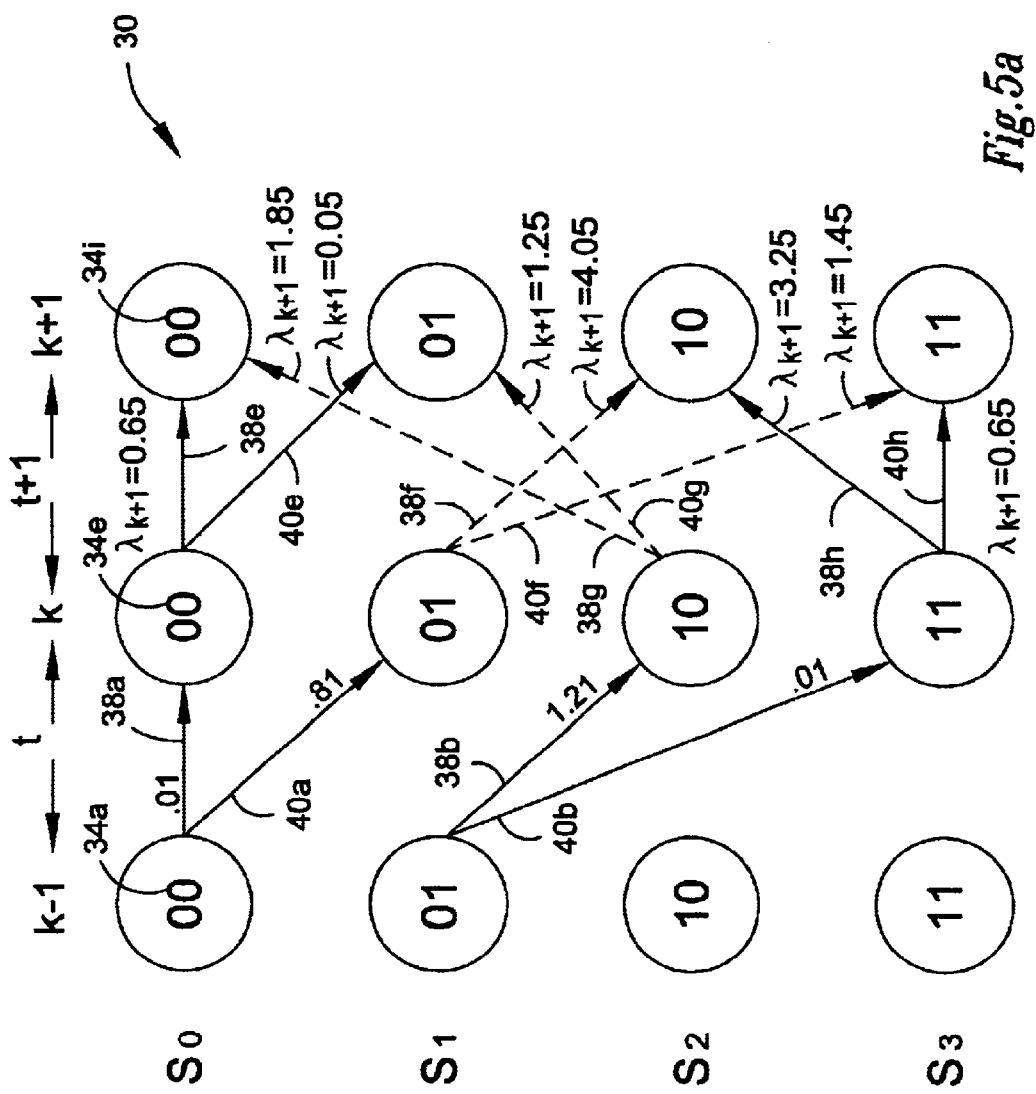
FIG. 5A is the trellis diagram of FIG. 4A at a subsequent sample time.
Figure 5B:
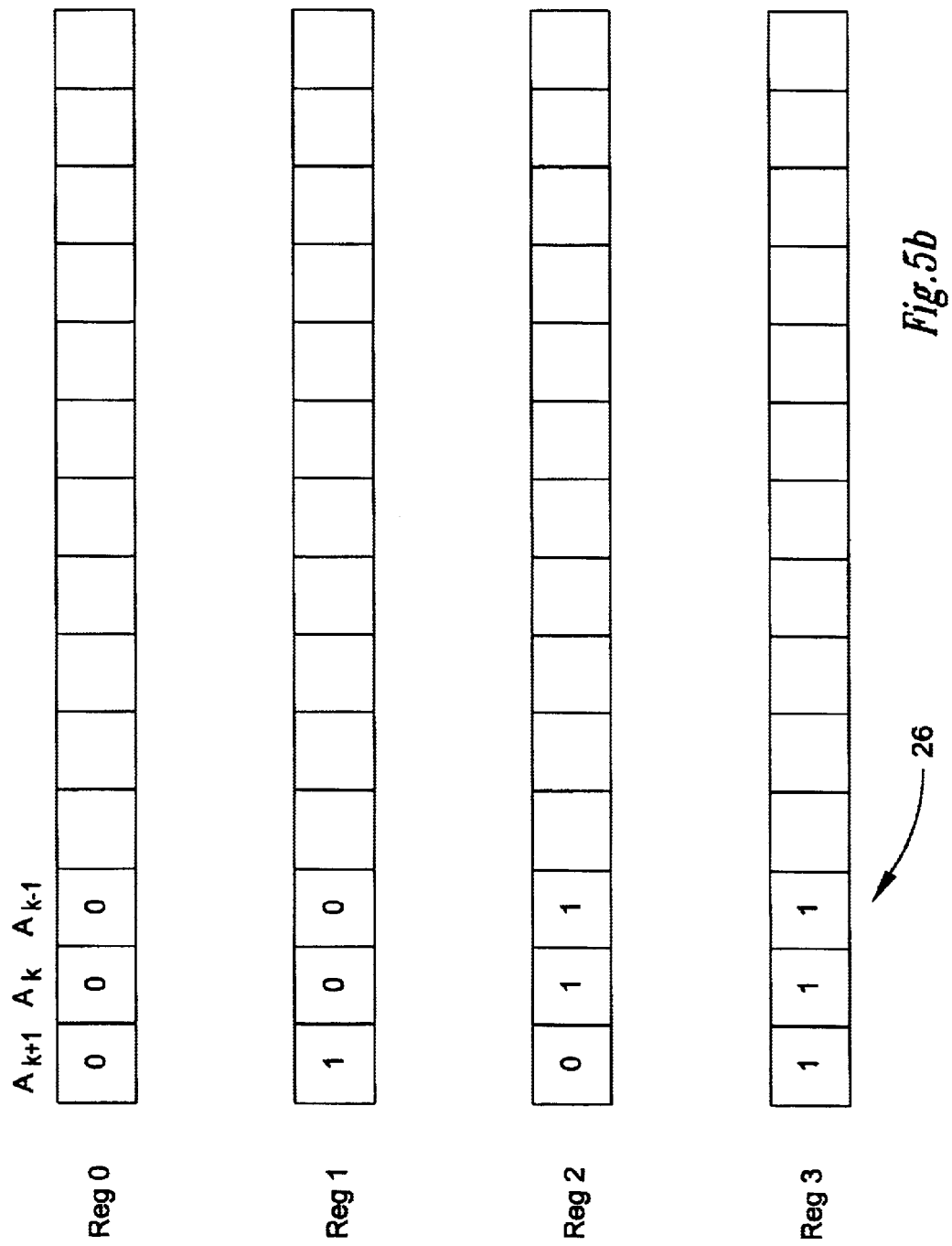
FIG. 5B shows the corresponding contents of the Viterbi-detector shift registers of FIG. 2 for the trellis diagram of FIG. 5A.
Figure 6A:
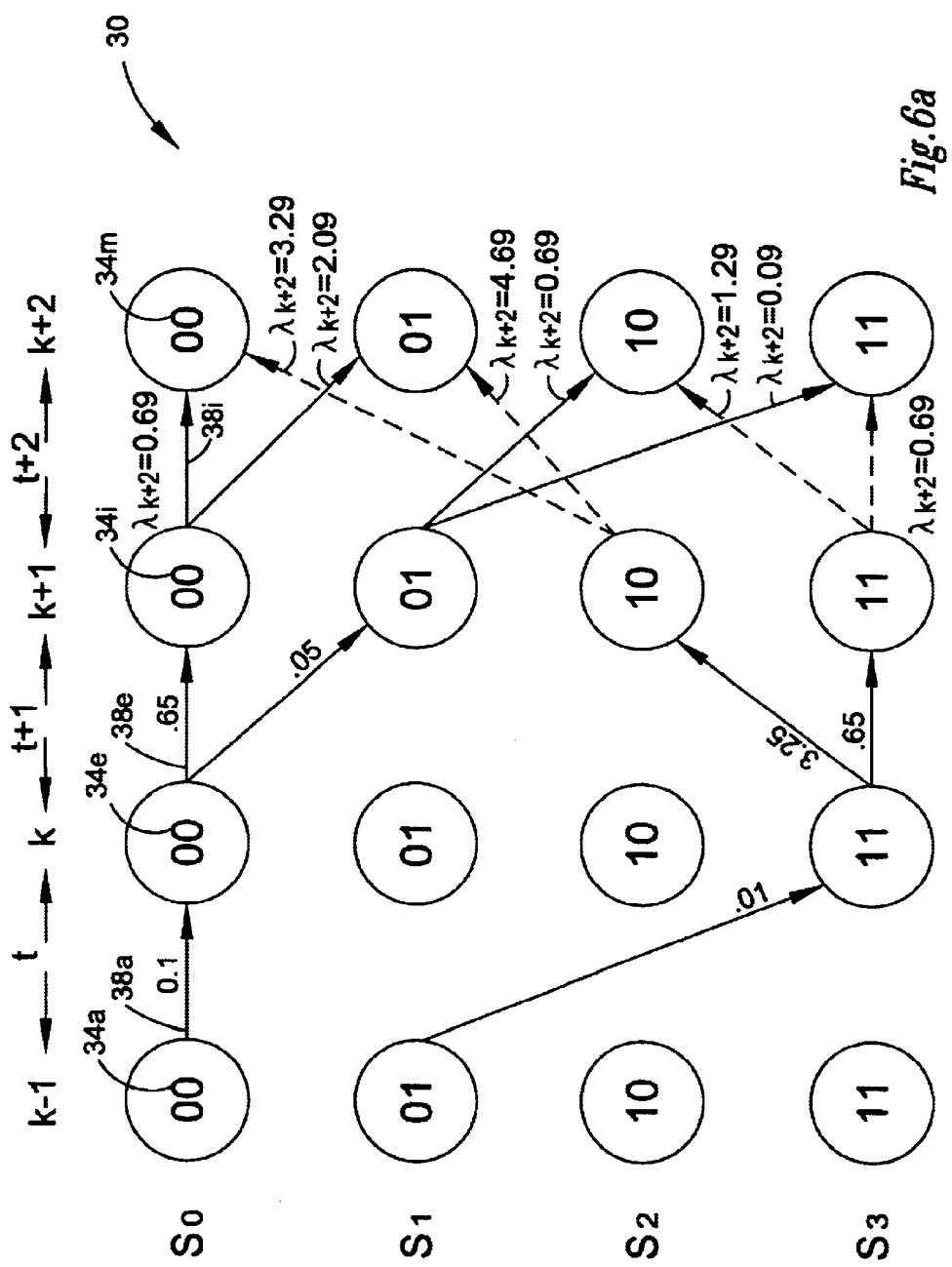
FIG. 6A is the trellis diagram of FIG. 5A at a subsequent sample time.
Figure 6B:
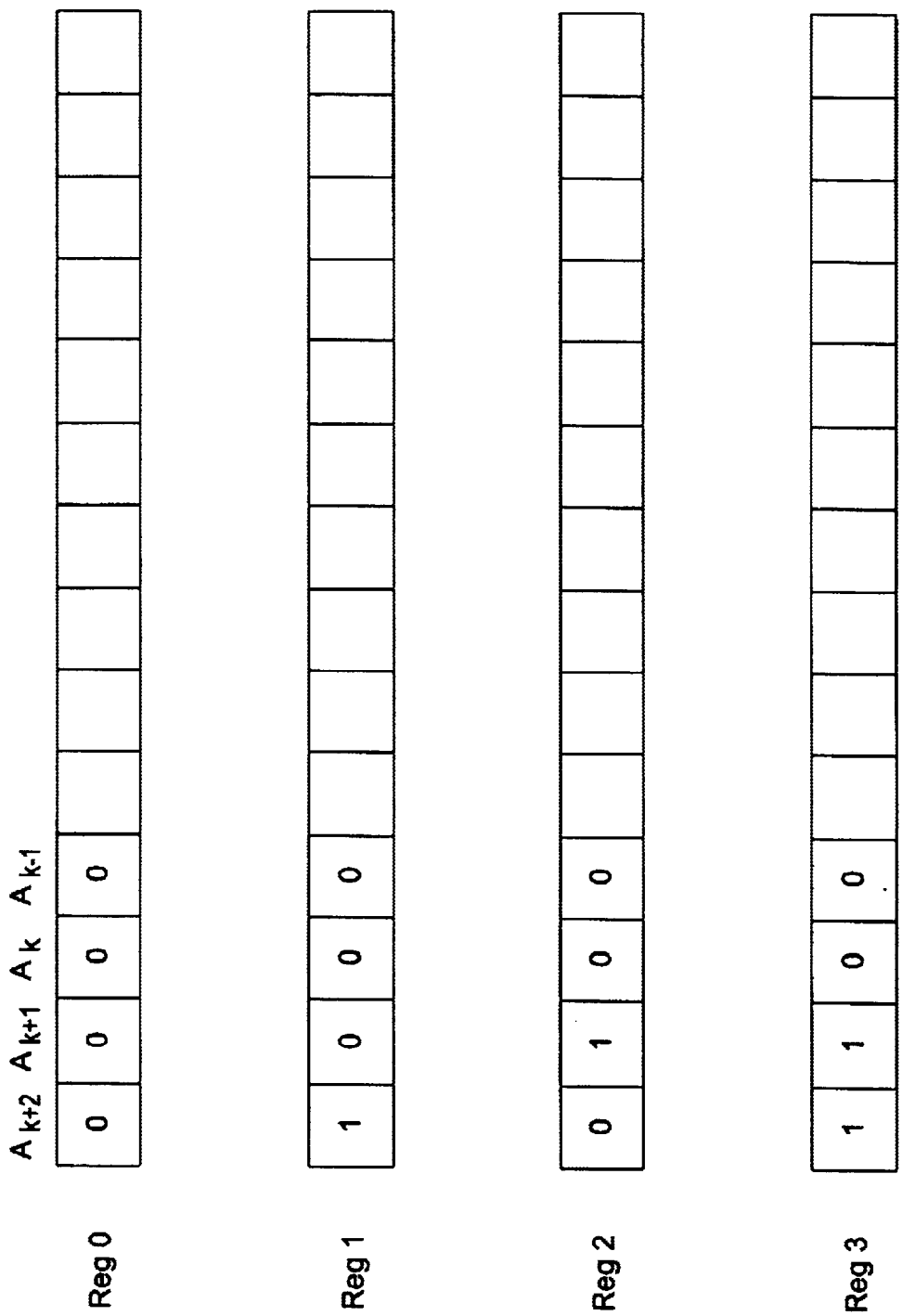
FIG. 6B shows the corresponding contents of the Viterbi-detector shift registers of FIG. 2 for the trellis diagram of FIG. 6A.
Figure 7A:
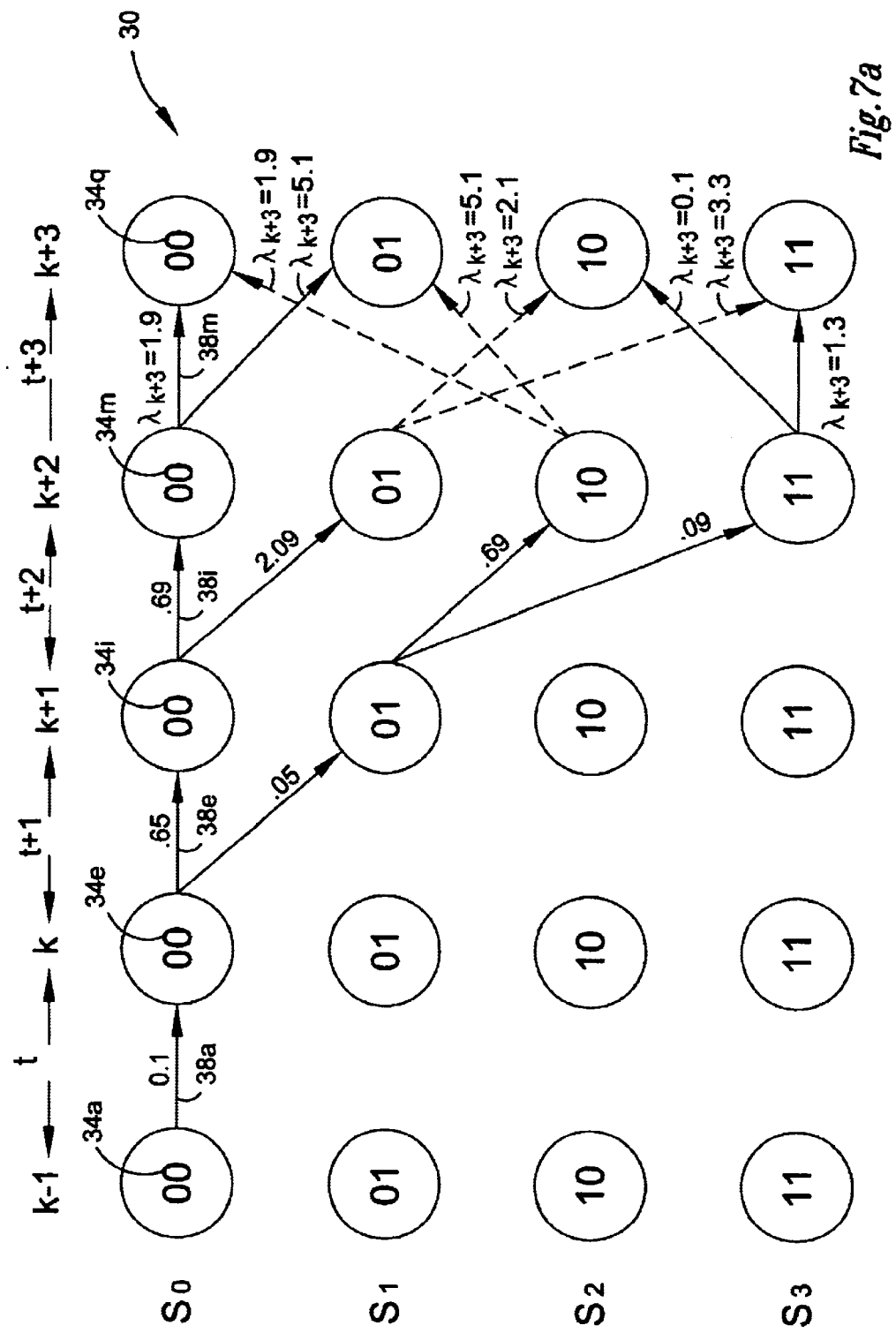
FIG. 7A is the trellis diagram of FIG. 6A at a subsequent sample time.
Figure 8A:
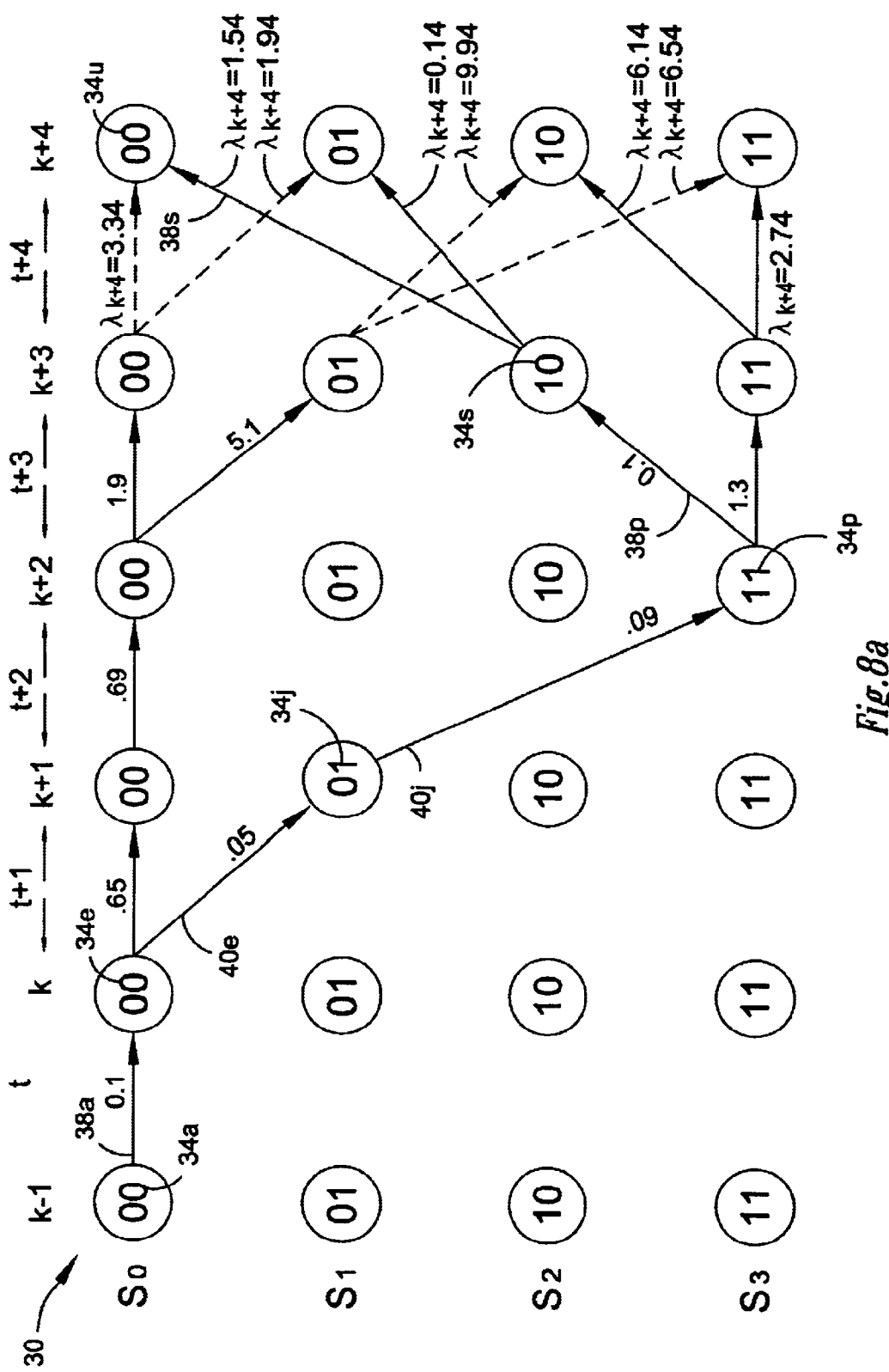
FIG. 8A is the trellis diagram of FIG. 7A at a subsequent sample time.
Figure 9A:
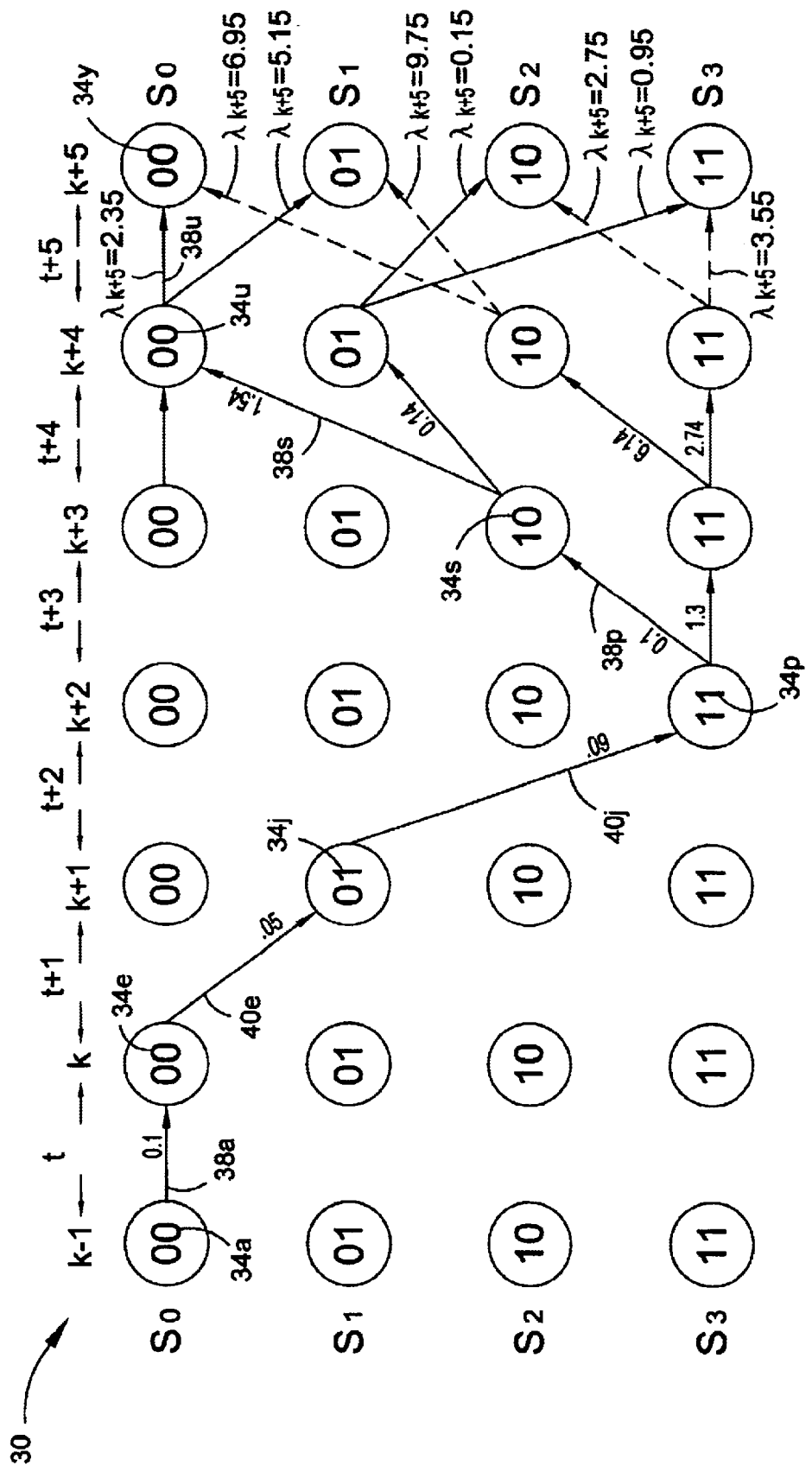
FIG. 9A is the trellis diagram of FIG. 8A at a subsequent sample time.
Figure 10A:
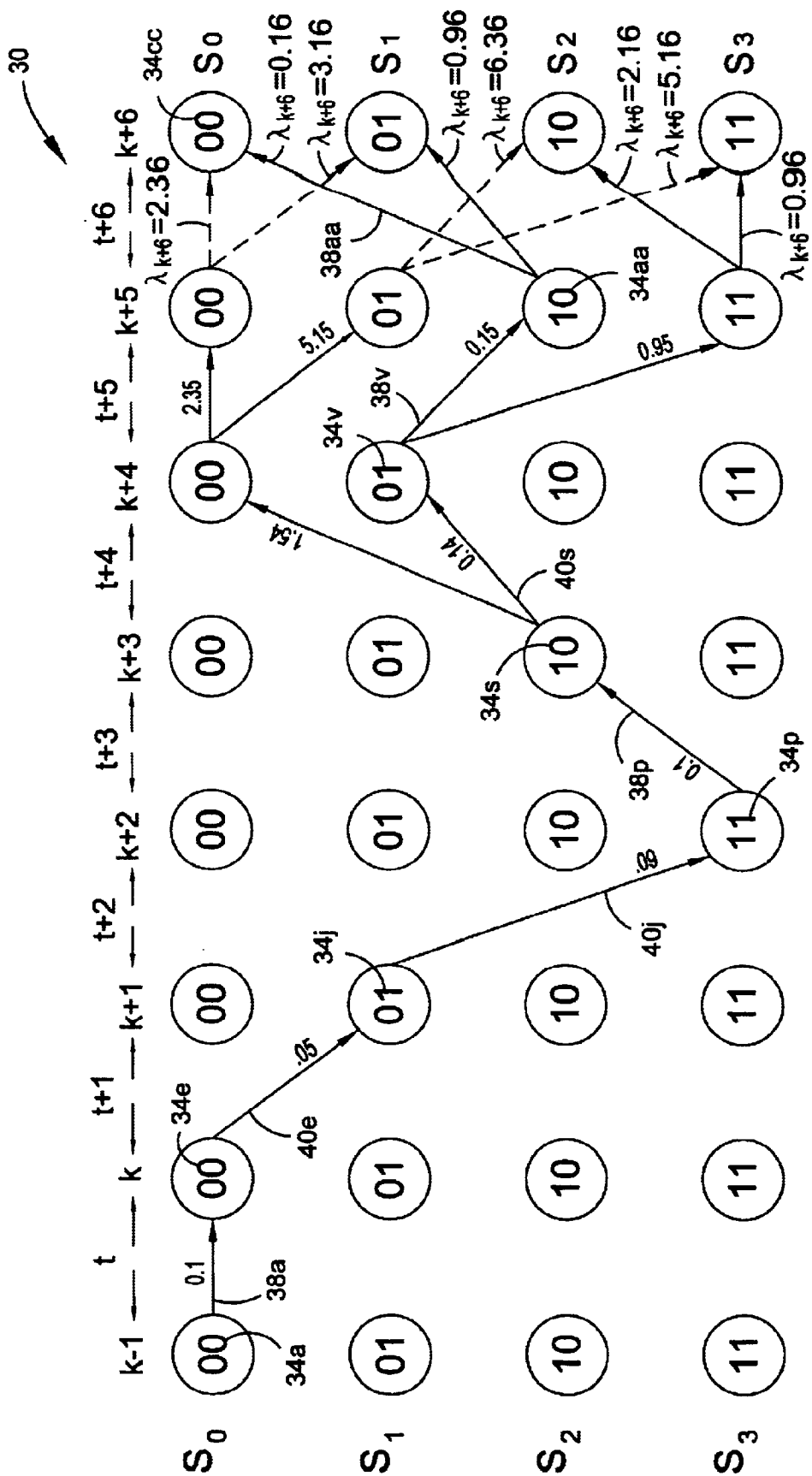
FIG. 10A is the trellis diagram of FIG. 9A at a subsequent sample time.
Figure 11:
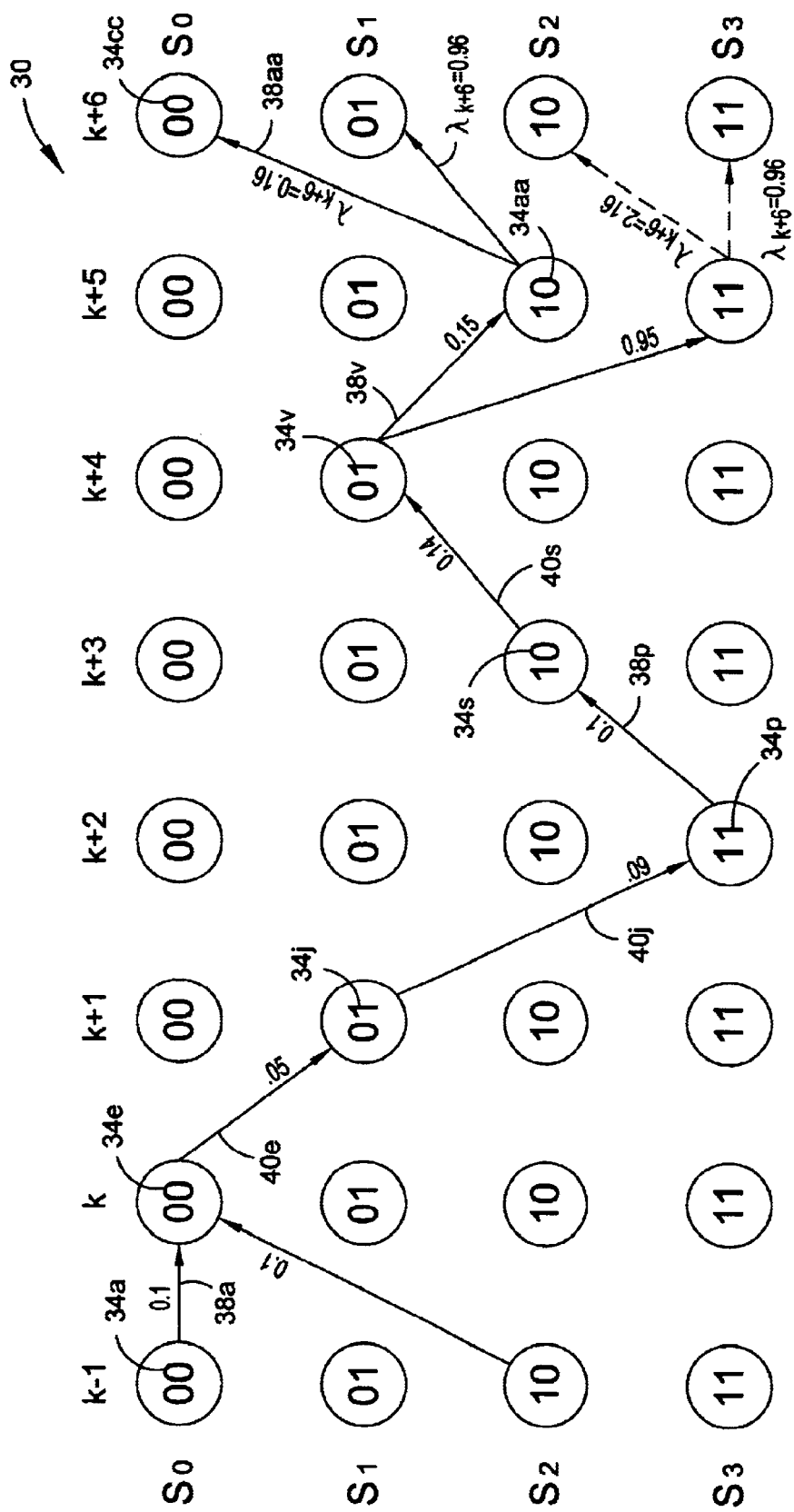
FIG. 11 is the trellis diagram of FIG. 10A showing the surviving paths only.

Thus, $B_k$ has five possible values: −2, −1, 0, 1, and 2. According to the convention of the trellis 30 of FIG. 3—that each state circle 32 includes the potential bits A upon which $B_k$ depends—each state circle 72 should include 4 bits: $A_k$, $A_{k-1}$, $A_{k-2}$, and $A_{k-3}$. But to simplify the trellis 70, each circle 72 has only three bits: 74 ($A_k$), 76 ($A_{k-1}$), and 78 ($A_{k-2}$). Consequently, $A_{k-3}$ is merely the bit 78 of the previous state circle 72 in the respective path. Therefore, ignoring parity recognition for the moment, this convention cuts the number of trellis states S in half from 16 to 8 states S0–S7 although it does not affect the detection algorithm represented by the trellis 70. Taking parity recognition into account, however, there are sixteen states: $S0_{even}$–$S7_{even}$ and $S0_{odd}$–$S7_{odd}$. For example, referring to state $S0_{even}$ at sample time k, if $A_{k+1}=1$ then the parity of the corresponding path changes from even parity to odd parity and the next state S at sample time k+1 is $S1_{odd}$. Therefore, so that the Viterbi detector 50 recognizes the parity of each trellis path, the trellis 70, and thus the corresponding detection algorithm, are constructed so that the detector 50 keeps track of each path's parity at each sample time k–k+n. A more detailed discussion of parity is included in U.S. patent application Ser. No. 10/295,411 entitled CODE AND METHOD FOR ENCODING DATA, which is heretofore incorporated by reference. Furthermore, although designed for an EPR4 protocol, one can modify the trellis 70 and the detection algorithm that it represents for use with other protocols according to the discussed principles.

Figure 14A:
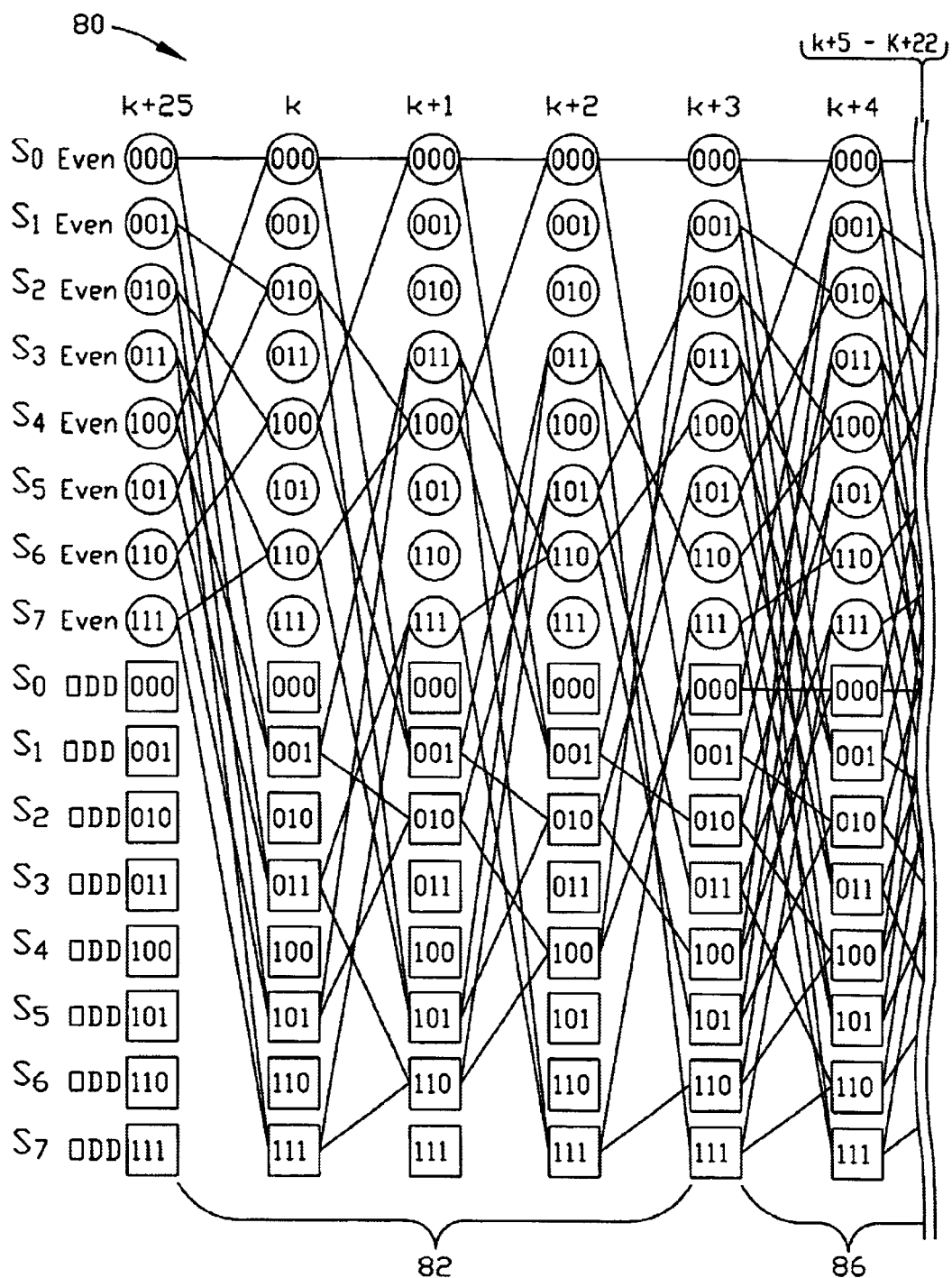
FIG. 14 is a trellis diagram for the Viterbi detector of FIG. 12 according to another embodiment of the invention.
Figure 14B:
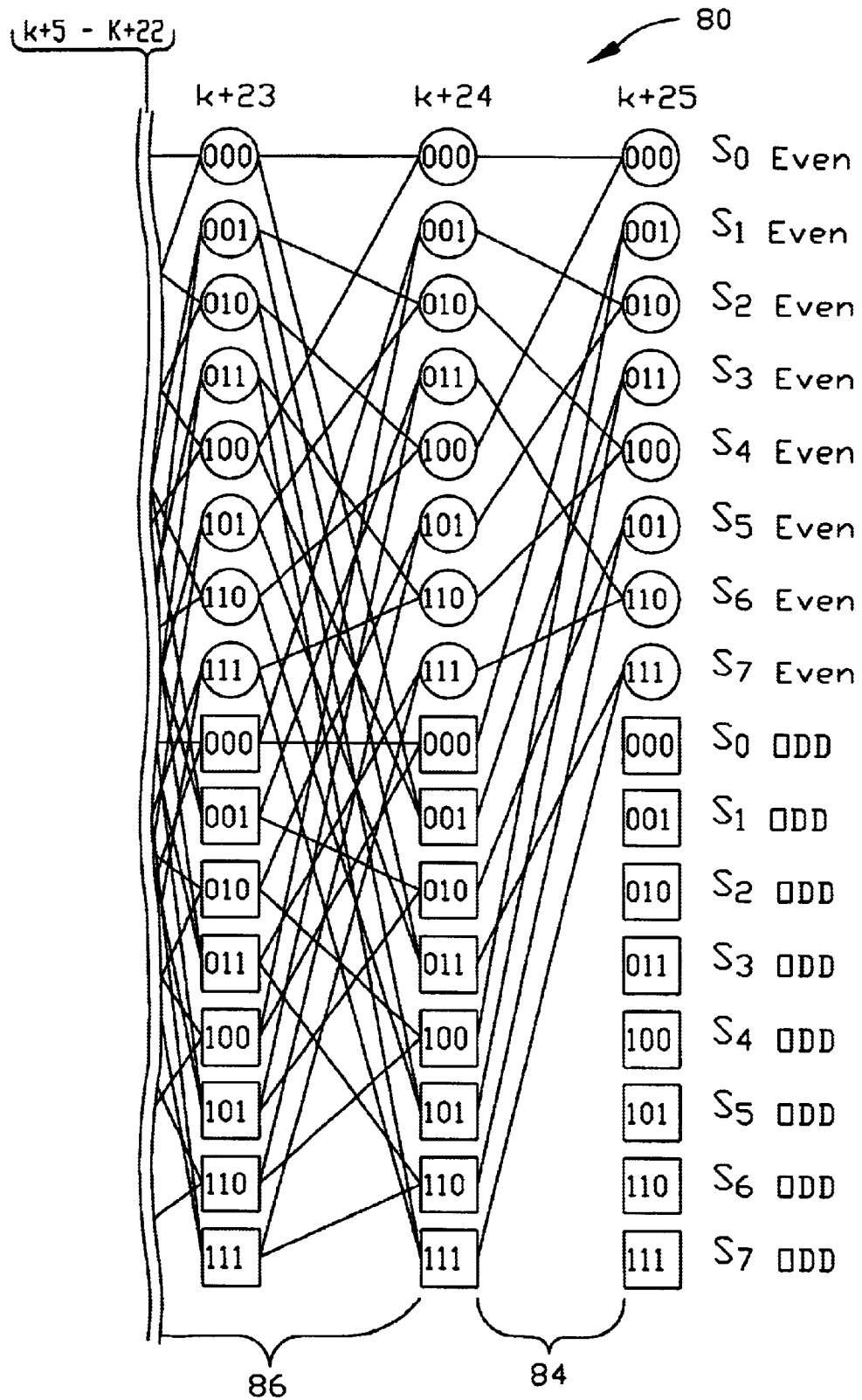

FIG. 14 is a trellis diagram 80, which represents a detection algorithm that is designed for an EPR4 protocol and that causes the Viterbi detector 50 to recover a binary sequence of 26-bit code words each having even parity and each including 1 parity bit according to an embodiment of the invention. The structure, generation, and storage of such a code word according to an embodiment of the invention is discussed in U.S. patent application Ser. No. 10/295,411 entitled CODE AND METHOD FOR ENCODING DATA, which is heretofore incorporated by reference. Furthermore, one can modify the detection algorithm according to the discussed principles for use with other protocols or with code words having multiple parity bits, odd parity, or lengths other than 26 bits.

Still referring to FIG. 14, the detection algorithm corresponding to the trellis 80 increases the accuracy of the Viterbi detector 50 by causing the detector 50 to periodically eliminate all surviving paths having odd parity and to thus recover a data sequence having even parity. Specifically, it follows that because each code word has even parity, the entire data sequence has even parity at the sample time corresponding to the last bit of the respective code word. To identify these even-parity sample times, the trellis 80 has 26 relative sample times k–k+25—one relative sample time for each bit in a 26-bit code word—which are used for each code word. That is, the trellis 80 is recursive, and thus repeats itself every 26 bits, i.e., once every 26-bit code word. The recovery circuit 60 aligns the last relative sample time k+25 of the trellis 80 with the last bit of each code word. For example, in the embodiment as discussed above in conjunction with FIG. 12, the transition of the synchronization signal identifies the next sample Z as corresponding to the first bit of the first code word in the data sequence. By aligning this first Z sample with the first relative sample time k of the trellis 80, respectively aligning the next 25 samples Z with the sample times k+1–k+25, respectively aligning the next 26 relative sample times with k–k+25, and so on, the recovery circuit 60 recognizes that each group of relative sample times k–k+25 corresponds to a respective code word and that the relative sample time k+25 corresponds to the last bit of a respective code word. Consequently, because each respective code word, and thus the data sequence, has even parity at each relative sample time k+25, the circuit 60 realizes that all of the valid surviving paths have even parity at relative sample time k+25. Thus, the circuit 60 can and does eliminate all of the surviving paths having odd parity at relative sample time k+25. The trellis 80 illustrates this elimination by having no branches that end on or originate from the odd-parity states $S0_{odd}$–$S7_{odd}$ at relative sample time k+25. By eliminating the odd-parity surviving paths, the circuit 60 recovers only code words having even parity. Assuming that the code words are constructed to have even parity, most read errors—the majority of read errors are single-bit or tri-bit errors—will cause the respective code words to have odd parity. Therefore, by periodically eliminating all odd-parity surviving paths, the circuit 60 eliminates most of the read errors, and thus more accurately recovers the even-parity code words of the data sequence.

Although the periodic elimination of odd-parity surviving paths-renders the Viterbi detector 50 more complex than some prior Viterbi detectors, the increased accuracy of the detector 50 more than offsets this increased complexity. Specifically, a consequence of the detection algorithm periodically eliminating the odd-parity surviving paths is that the recursive trellis 80 includes partially connected portions 82 and 84 in addition to a fully connected portion 86. As the trellis 80 illustrates, the partial branch patterns within the portions 82 and 84 are different from one another and from the full branch pattern within the portion 86. Because the recovery circuit 60 is constructed to implement all of these branch patterns during the respective sampling periods, it typically includes more complex circuitry and occupies more area than a recovery circuit such as the circuit 24 (FIG. 3) that is constructed to implement the same branch pattern during each sampling period. But as stated above, the increased accuracy of the detector 50 more than compensates for the increased circuit complexity and size of the recovery circuit 60.

Still referring to FIG. 14, one can determine the detailed state-by-state operation of the Viterbi detector 50 of FIG. 12 according to an embodiment of the invention by traversing the trellis 80 in a manner similar to that described above in conjunction with FIGS. 4A–11. Specifically, one can use equation (7) to calculate the B values for the respective branches of the trellis 80, and can use equations (5) and (6) to respectively calculate the branch lengths X and update the path lengths λ. Furthermore, because there are 16 possible states $S0_{even}$–$S7_{even}$ and $S0_{odd}$–$S7_{odd}$, the detector 50 includes at least 16 shift registers Reg0–Reg$7_{even}$ and Reg$0_{odd}$–Reg0 (not shown), which compose the shift registers 62. In one embodiment, the recovery circuit loads Reg$0_{even}$–Reg$7_{even}$ and Reg$0_{odd}$–Reg$7_{odd}$ in a manner similar to that discussed above in conjunction with FIGS. 4B, 5B, 6B, 7B, 8B, 9B, and 10B. Using simulations, the inventors have found that the detector 50 has a latency of approximately 50 samples when implementing the detection algorithm represented by the trellis 80.

Viewing the Viterbi detector 50 and the trellis 80 from another perspective, the detector 50 eliminates all of the odd-parity surviving paths, and thus rejects all odd-parity code words, by always choosing the same one of the two possible surviving paths to each state S0–S3, respectively, at relative sample time k+3. The trellis 80 illustrates this choice by including only these chosen paths—one respective path to each state S at time k+3—between times k+2 and k+3. Consequently, following the possible surviving paths from time k+3 back to time k, this choice causes the detector 50 to always eliminate the paths through the odd even-parity states $S1_{even}$, $S3_{even}$, $S5_{even}$, and $S7_{even}$ and the paths through the even odd-parity states $S0_{odd}$, $S2_{odd}$, $S4_{odd}$, and $S6_{odd}$ at time k. Thus, the detector 50 eliminates the states $S1_{even}$, $S3_{evens}$ $S5_{even}$, $S7_{even}$, $S0_{odd}$, $S2_{odd}$, $S4_{odd}$, and $S6_{odd}$ at time k. The trellis 80 illustrates this path/state elimination by including no paths to or from these eliminated states at time k. This path/state elimination at time k flows from the following analysis. At time k+25, the code word has even parity. Therefore, the next data bit being logic 1 forces the data sequence to have odd parity at time k, and the next bit being logic 0 forces the data sequence to have even parity at time k. Hence, the only possible odd states (next bit being logic 1) at time k have odd parity, and the only possible even states (next bit being logic 0) at time k have even parity.

Figure 1:
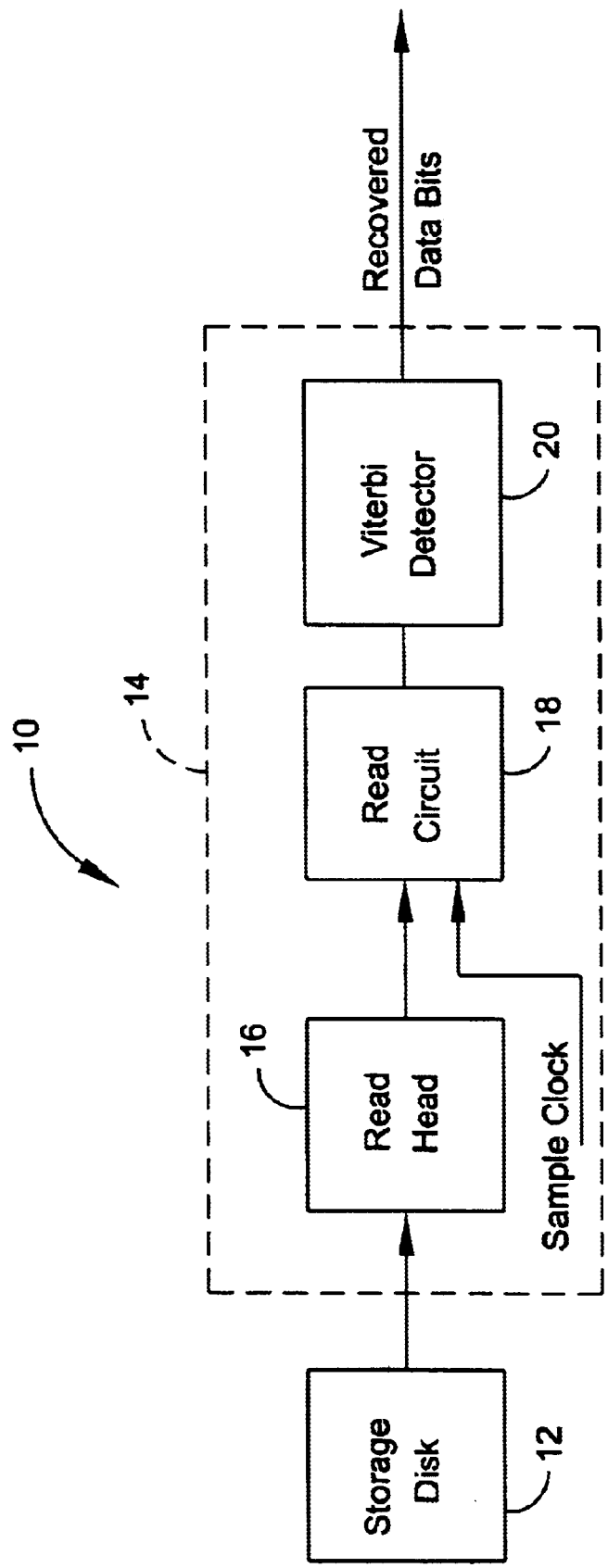
FIG. 1 is a block diagram of a disk-drive read channel according to the prior art.

FIGS. 15–18 are respective portions 90a–90d of a trellis diagram 90 according to an embodiment of the invention. The trellis 90 represents the same algorithm as the trellis 80 (FIG. 14), but for the Viterbi detector 50 (FIG. 12) processing two Z samples at a time instead of one Z sample at a time. For example, the read head such as the read head 16 of FIG. 1 can be constructed to sense two bit locations at a time. This further increases the speed of the detector 50, and thus further increases the effective data-read speed of the disk drive. For clarity, upper case "K" is used to distinguish the sample times of the trellis 90 from the sample times "k" of the trellis 80, and upper case "T" is used to distinguish the dual-sample periods of the trellis 90 from the single-sample periods "t".

Figure 15:
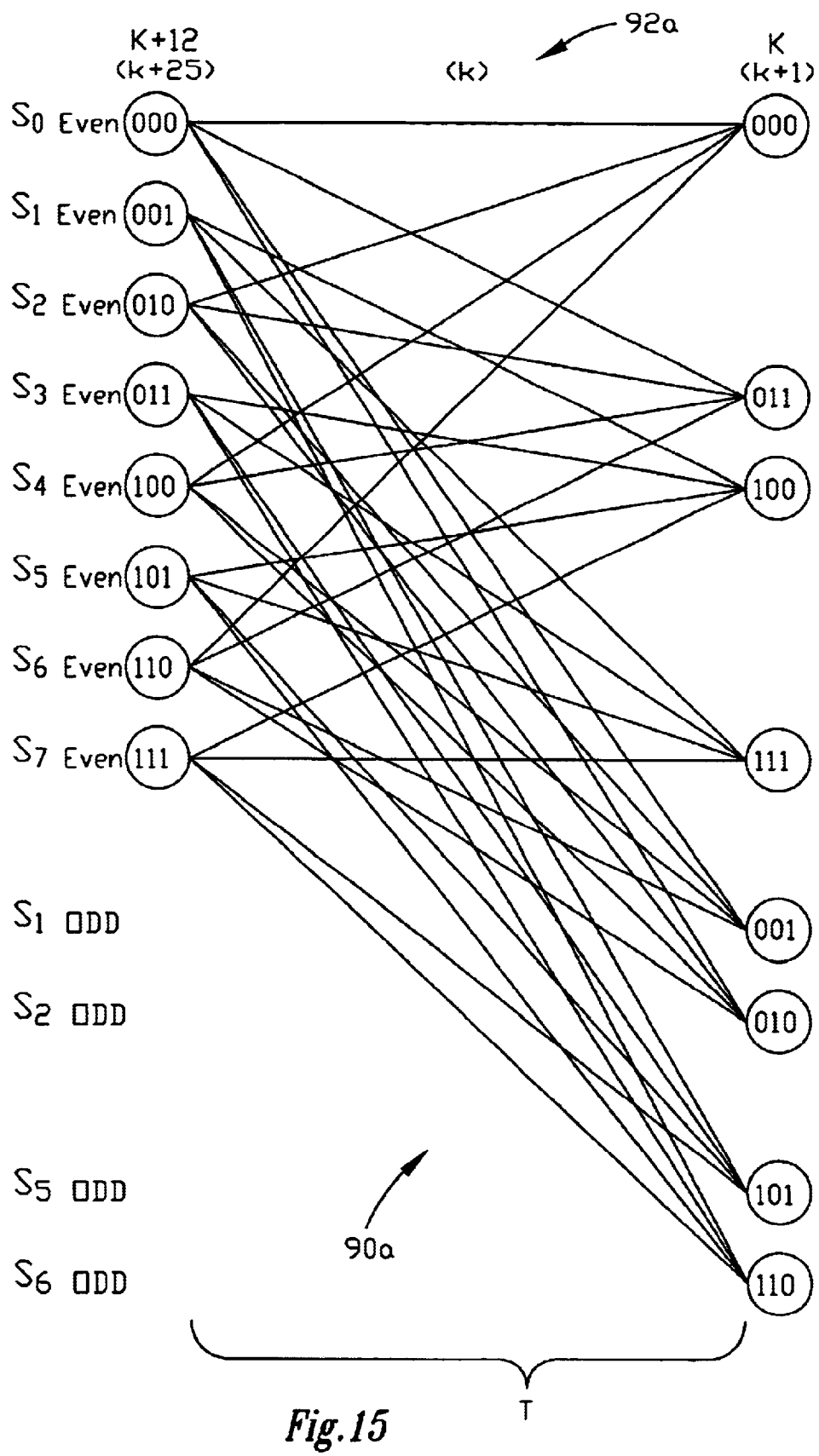
FIGS. 15–18 are respective portions of a trellis diagram for the Viterbi detector of FIG. 12 according to yet another embodiment of the invention.

Referring to FIG. 15, the branches 92a represent all possible paths between the states S at the relative sample time K+12, which corresponds to the last two bits of one code word, and the states S at the relative sample time K, which corresponds to the first two bits of the next code word. The relative locations of the relative sample times k+25, k, and k+1 of the trellis 80 are shown in parenthesis. Therefore, the recovery circuit 60 processes a double sample $ZK-Z_k$ and $Z_{k+1}$ with respect to the trellis 80—during a dual-sample period T between sample times K+12 and K–k+25 and k+1 with respect to the trellis 80. One can easily construct the branches 92a by following the possible paths in the trellis 80 from the states S at sample time. k+25 to the states S at sample time k+1. For example, starting at $S0_{even}$ at sample time k+25 of the trellis 80, there are four possible end points at sample time k+1: $S0_{even}$, $S1_{odd}$, $S3_{even}$, and $S2_{odd}$. As predicted by this analysis of the trellis 80, the branches 92a from $S0_{even}$ end on the states $S0_{even}$, $S1_{odd}$, $S3_{even}$, and $S2_{odd}$.

Figure 16:
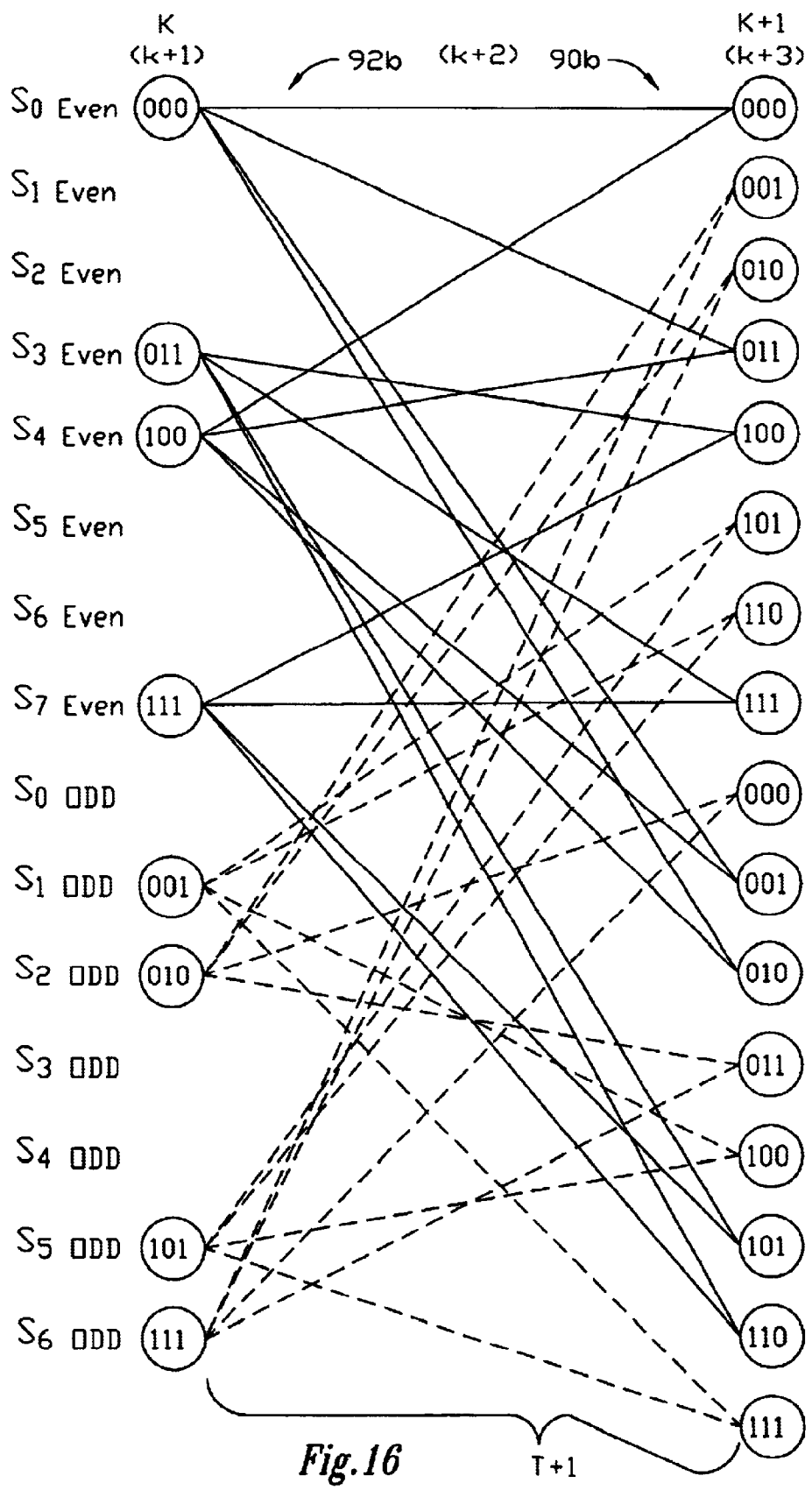

FIG. 16 is the portion 90b of the trellis 90. The portion 90b has branches 92b and a dual-sample period T+1 between sample times K and K+1—sample times k+1 and k+2 with respect to the trellis 80.

Figure 17:
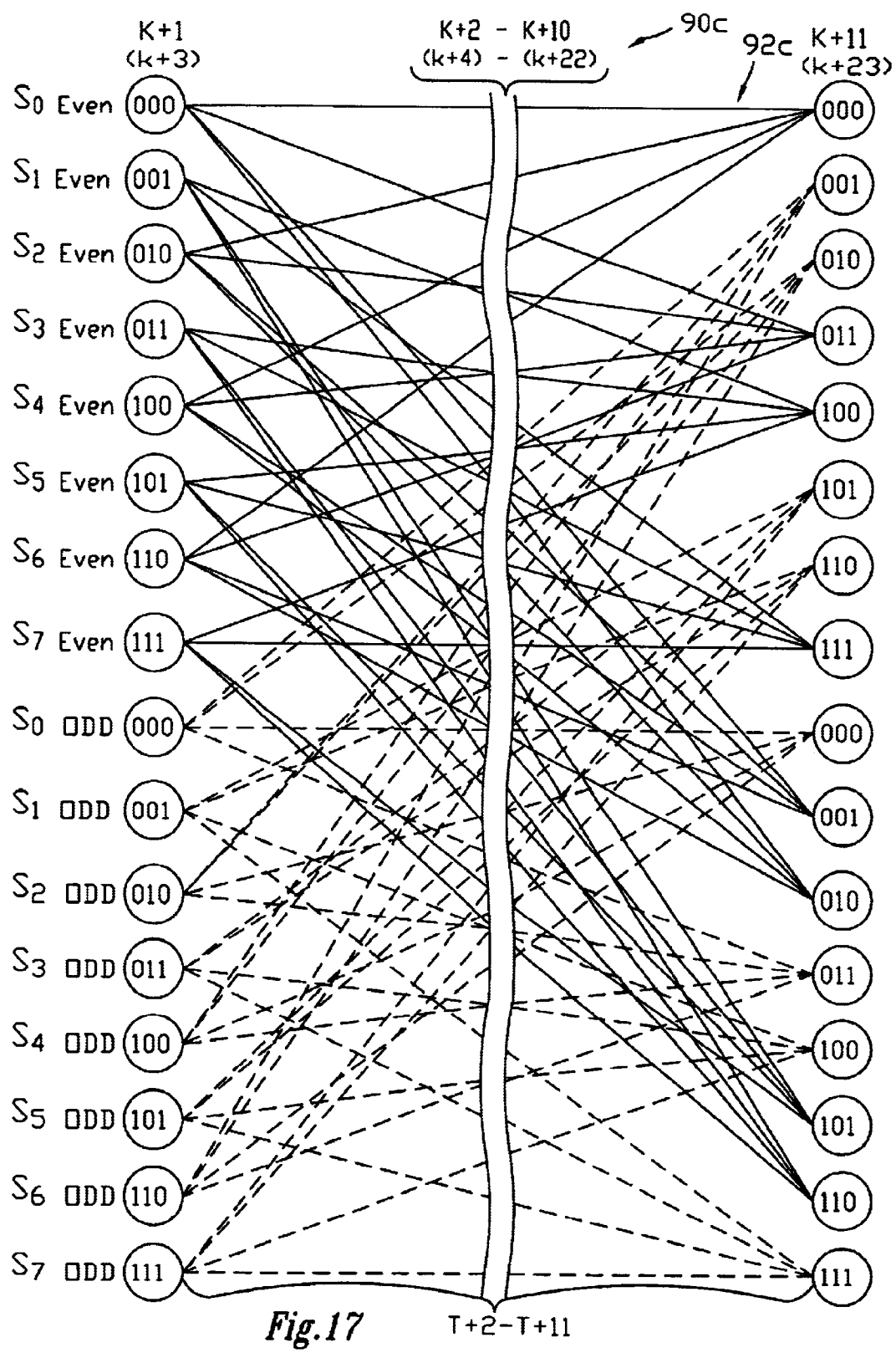

FIG. 17 is the fully connected portion 90c of the trellis 90. The portion 90c has branches 92c and dual-sample periods T+2–T+11 between sample times K+1 and K+1—sample times k+3 and k+23 with respect to the trellis 80.

Figure 18:
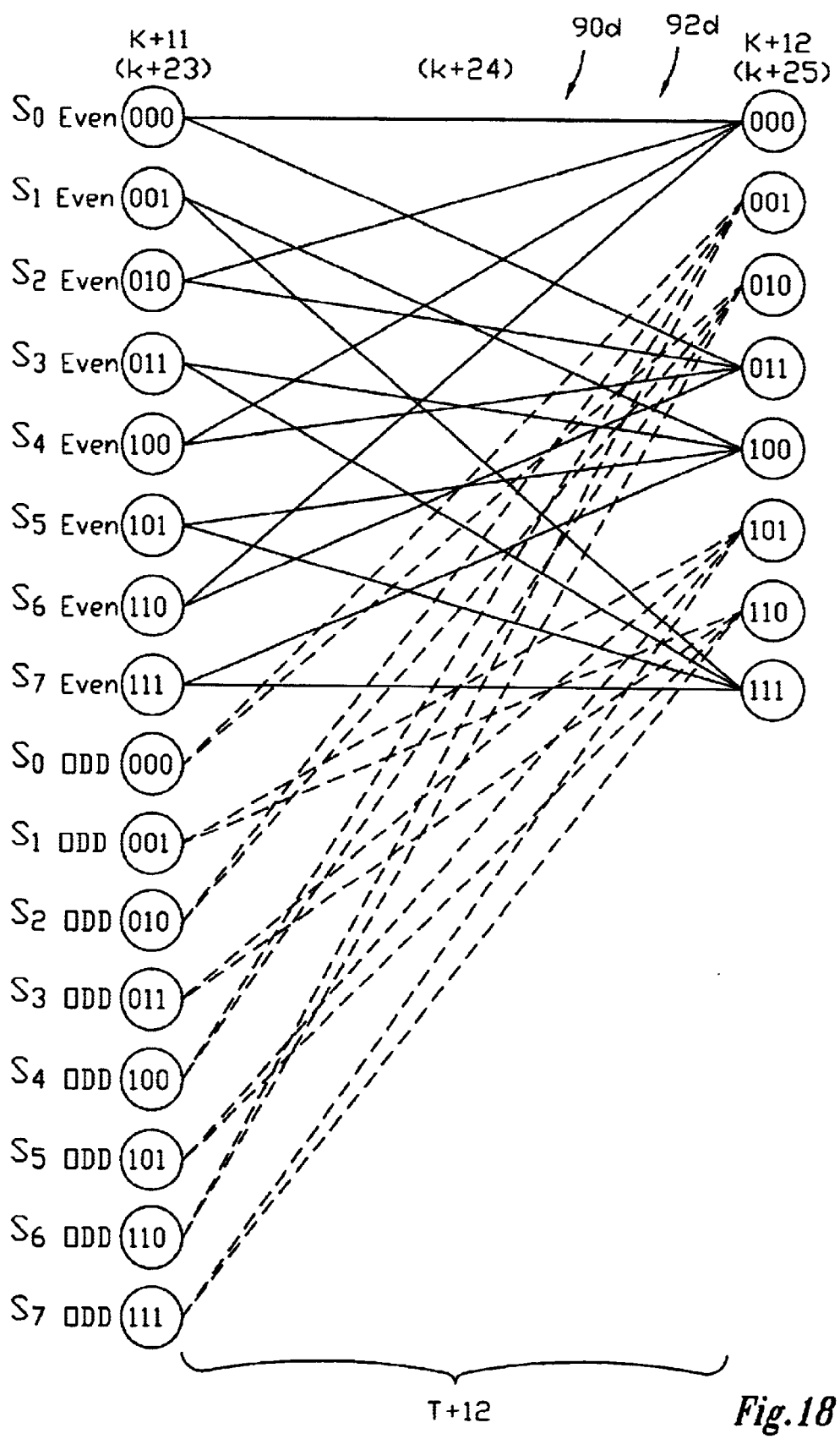

FIG. 18 is the portion 90d of the trellis 90. The portion 90d has branches 92d and a dual-sample period T+12 between sample times K+11 and K+12—sample times k+23 and k+25 with respect to the trellis 80.

Figure 19:
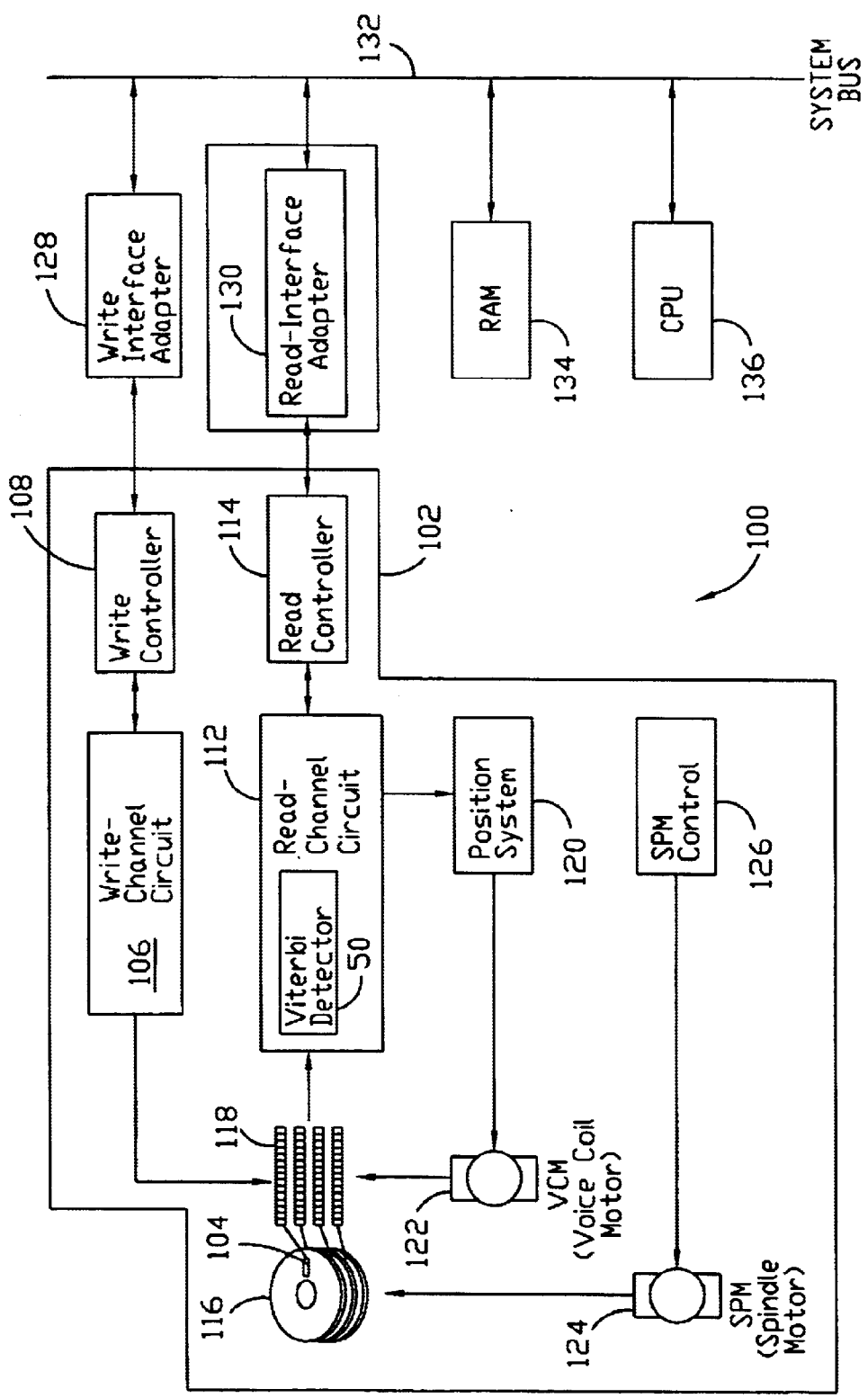
FIG. 19 is a block diagram of a disk-drive system that incorporates the Viterbi detector of FIG. 12 according to an embodiment of the invention.

FIG. 19 is a block diagram of a disk-drive system 100according to an embodiment of the invention. Specifically, the disk-drive system 100 includes a disk drive 102, which incorporates the Viterbi detector 50 of FIG. 12. The disk drive 102 includes a combination write/read head 104, a write-channel circuit 106 for generating and driving the head 104 with a write signal, and a write controller 108 for interfacing the write data to the write-channel circuit 106. In one embodiment, the. write-channel circuit 106 includes the data encoder disclosed in. U.S. patent application Ser. No. 10/295,411 entitled CODE AND METHOD FOR ENCODING DATA, which is heretofore incorporated by reference. The disk drive 102 also includes a read-channel circuit 112 for receiving a read signal from the head 104 and for recovering the written data from the read signal, and includes a read controller 114 for organizing the read data. In one embodiment, the read-channel circuit 112 is similar to the read channel 14 of FIG. 1 except that it includes the data decoder disclosed in U.S. patent application Ser. No. 10/295,411 entitled CODE AND METHOD FOR ENCODING DATA, the read head 16 is omitted, and the Viterbi detector 20 is replaced with the Viterbi detector 50. The disk drive 142 further includes a storage medium such as one or more disks 116, each of which may contain data on one or both sides. The write/read head 104 writes/reads the data stored on the disks 116 and is connected to a movable support arm 118. A position system 120 provides a control signal to a voice-coil motor (VCM) 122, which positionally maintains/moves the arm 118 so as to positionally maintain/radially move the head 104 over the desired data on the disks 116. A spindle motor (SPM) 124 and a SPM control circuit 126 respectively rotate the disks 116 and maintain them at the proper rotational speed.

The disk-drive system 100 also includes write and read interface adapters 128 and 130 for respectively interfacing the write and read controllers 108 and 114 to a system bus 132, which is specific to the system used. Typical system busses include ISA, PCI, S-Bus, Nu-Bus, etc. The system 100 also typically has other devices, such as a random access memory (RAM) 134 and a central processing unit (CPU) 136 coupled to the bus 132.

From the foregoing it will be appreciated that, although specific embodiments of the invention have been described herein for purposes of illustration, various modifications may be made without deviating from the spirit and scope of the invention.

What is claimed is:

1. A Viterbi detector, comprising:
   an input terminal operable to receive a signal that represents a sequence of values;
   a register; and
   a recovery circuit coupled to the input terminal and to the register, the circuit operable to,
      recover the sequence from the signal by,
         identifying surviving paths of potential sequence values, and
         periodically eliminating the identified surviving paths having a predetermined parity, and
      load the recovered sequence into the register.

2. The Viterbi detector of claim 1 wherein the predetermined parity comprises odd parity.

3. A Viterbi detector, comprising:
an input terminal operable to receive a signal that represents a sequence of values;
a register; and
a recovery circuit coupled to the input terminal and to the register, the circuit operable to,
recover only groups of values having a predetermined parity, and
load the recovered groups into the register.

4. The Viterbi detector of claim 3 wherein the predetermined parity comprises even parity.

5. The Viterbi detector of claim 3 wherein the groups of values each comprises a respective set of data bits and a respective set of code bits.

6. The Viterbi detector of claim 3 wherein the groups of values each comprises a respective set of data bits, a respective set of code bits, and a respective parity bit.

7. The Viterbi detector of claim 3 wherein the groups of values each comprise a respective code word that includes twenty six bits, one of the bits being a parity bit.

8. The Viterbi detector of claim 3 wherein the recovery circuit is operable identify the respective beginnings of each of the groups of values.

9. A Viterbi detector, comprising:
an input terminal operable to receive a signal that represents a sequence of values;
a register; and
a circuit coupled to the input terminal and to the register, the circuit operable to,
recover the sequence from the signal by calculating a branch length between a first potential state of the sequence representing a first sequence parity and a second potential state of the sequence representing a second sequence parity, and
load the recovered sequence into the register.

10. The Viterbi detector of claim 9 wherein the sequence of values comprises a sequence of binary values.

11. The Viterbi detector of claim 9 wherein:
the first sequence parity comprises even parity; and
the second sequence parity comprises odd parity.

12. The Viterbi detector of claim 9 wherein:
the register comprises a shift register; and
the circuit is operable to shift the recovered sequence into the shift register.

13. A Viterbi detector, comprising:
an input terminal operable to receive a signal that represents a sequence of values;
a register; and
a circuit coupled to the input terminal and to the register, the circuit operable to,
calculate a first set of branch lengths between first and second sets of possible sequence states according to a first set of branches, each branch originating from a respective state that represents a first sequence parity,
calculate a second set of branch lengths between third and fourth sets of possible sequence states according to a second set of branches, each branch ending on a respective state that represents a second sequence parity,
recover the sequence of values from the first and second sets of branch lengths, and
load the recovered sequence into the register.

14. The Viterbi detector of claim 13 wherein:
the values in the sequence comprise respective code words; and
the circuit is operable to generate a recovered sequence of code words from the first and second sets of branch lengths.

15. The Viterbi detector of claim 13 wherein the circuit is operable to generate the recovered sequence of values by:
calculating a set of path lengths from the first and second sets of branch lengths;
identifying a state path that corresponds to the smallest one of the path lengths; and
generating the recovered sequence of values equal to the sequence of states in the state path.

16. The Viterbi detector of claim 13 wherein each of the first, second, third, and fourth sets of potential sequence states equal one another.

17. A Viterbi detector, comprising:
an input terminal operable to receive a signal that represents a code word;
a register; and
a circuit coupled to the input terminal and to the register, the circuit operable to,
calculate path lengths according to a first set of state-transition branches,
update the path lengths more than once according to a second set of state-transition branches that is different than the first set,
update the path lengths according to a third set of state-transition branches that is different than the first and second sets,
recover the code word from the updated path lengths, and
load the recovered code word into the register.

18. The Viterbi detector of claim 17 wherein the code word comprises a set of data bits, a set of code bits, and a parity bit.

19. The Viterbi detector of claim 17, further comprising:
a synchronization terminal operable to receive a synchronization signal; and
wherein the circuit is operable identify the beginning of the code word in response to the synchronization signal.

20. A disk-drive system, comprising:
a data-storage disk having- a surface and operable to store information values;
a motor coupled to and operable to rotate the disk;
a read head operable to generate a read signal;
a read-head positioning assembly operable to move the read head over the surface of the disk; and
a Viterbi detector coupled to the read head and operable to recover a sequence of the stored information values from the read signal by calculating a branch length between first and second potential states of the sequence, the first potential state representing a first parity of the sequence and the second potential state representing a second parity of the sequence.

21. The disk-drive system of claim 20 wherein each of the information values comprises a respective information bit.

22. The disk-drive system of claim 20 wherein:
the stored information values compose a code word; and
the Viterbi detector is operable to receive a synchronization signal and identify the beginning of the code word in response to the synchronization signal.

23. The disk-drive system of claim 20, further comprising:
a register; and
wherein the Viterbi detector is operable to load the recovered sequence into the register.

24. A method for recovering a sequence of values from a signal, the method comprising:
identifying surviving paths of potential sequence values; and
periodically eliminating the identified surviving paths having a predetermined parity.

25. The method of claim 24 wherein the predetermined parity comprises odd parity.

26. A method for recovering a sequence of values from a signal, the method comprising:
receiving the signal; and
recovering with a Viterbi detector only groups of the values having a predetermined parity.

27. The method of claim 26 wherein the predetermined parity comprises even parity.

28. The method of claim 26 wherein the groups of values each comprises a respective set of data bits, a respective set of code bits, and a respective parity bit.

29. A method, comprising:
receiving a signal that represents a sequence of values; and
recovering the sequence from the signal by calculating a branch length between first and second possible sequence states that represent different parities of the sequence.

30. The method of claim 29 wherein the first state does not equal the second state.

31. The method of claim 29 wherein:
the first state represents odd parity; and
the second state represents even parity.

32. A method, comprising:
receiving a signal that represents a sequence of values;
calculating first branch lengths between first potential sequence states and second potential sequence states along respective first state-transition branches, each first state-transition branch originating from a respective first state that represents a first parity of the sequence;
calculating second branch lengths between third potential sequence states and fourth potential sequence states along respective second state-transition branches, each second state-transition branch ending on a respective fourth state that represents a second parity of the sequence; and
recovering the sequence from the signal using the first and second branch lengths.

33. The method of claim 32 wherein the first states, second states, third states, and fourth states respectively equal one another.

34. The method of claim 32 wherein th e first parity is the same as the second parity.

35. A method, comprising:
receiving a signal that represents a code word;
calculating path lengths during a first period according to a first set of state-transition branches;
updating the path lengths during a plurality of periods following the first period according to a second set of state-transition branches that is different than the first set;
updating the path lengths during a third period following the plurality of periods according to a third set of state-transition branches that is different than the first and seconds sets; and
recovering the code word from the signal using the updated path lengths.

36. The method of claim 35 wherein all of the branches in the first set respectively originate from potential sequence states that represent the same parity of the code word.

37. The method of claim 35 wherein all of the branches in the third set respectively end on potential sequence states that represent the same parity of the code word.

38. The method of claim 35 wherein one branch in each of the first, second, and third sets of state-transition branches originates from a respective potential sequence state that represents a parity of the code word and ends on a respective potential sequence state that represents a different parity of the code word.

39. The method of claim 35, further comprising identifying the beginning of the code word.

40. The method of claim 35, further comprising:
receiving a synchronization signal; and
using the synchronization signal to identify the beginning of the code word.

* * * * *